United States Patent
Prakash et al.

(10) Patent No.: US 10,726,891 B1
(45) Date of Patent: Jul. 28, 2020

(54) REDUCING POST-READ DISTURB IN A NONVOLATILE MEMORY DEVICE

(71) Applicant: Western Digital Technologies, Inc., San Jose, CA (US)

(72) Inventors: Abhijith Prakash, Milpitas, CA (US); Anubhav Khandelwal, San Jose, CA (US); Deepanshu Dutta, Fremont, CA (US); Huai-Yuan Tseng, San Ramon, CA (US); Wei Zhao, Fremont, CA (US); Dengtao Zhao, Santa Clara, CA (US)

(73) Assignee: Western Digital Technologies, Inc., San Jose, CA (US)

(*) Notice: Subject to any disclaimer, the term of this patent is extended or adjusted under 35 U.S.C. 154(b) by 0 days.

(21) Appl. No.: 16/415,457

(22) Filed: May 17, 2019

Related U.S. Application Data

(60) Provisional application No. 62/804,889, filed on Feb. 13, 2019.

(51) Int. Cl.
| | |
|---|---|
| G11C 7/00 | (2006.01) |
| G11C 11/06 | (2006.01) |
| G06F 11/10 | (2006.01) |
| H01L 27/11524 | (2017.01) |
| G11C 11/16 | (2006.01) |
| G11C 16/34 | (2006.01) |

(52) U.S. Cl.
CPC .... G11C 11/06057 (2013.01); G06F 11/1044 (2013.01); G11C 11/1657 (2013.01); G11C 16/3427 (2013.01); H01L 27/11524 (2013.01)

(58) Field of Classification Search
CPC .......... G11C 11/06057; G11C 11/1044; G11C 11/1657; G11C 11/3427
USPC ........................................................ 365/204
See application file for complete search history.

(56) References Cited

U.S. PATENT DOCUMENTS

| | | | |
|---|---|---|---|
| 9,147,473 B2* | 9/2015 | Kim ..................... | G11C 16/08 |
| 9,336,892 B1* | 5/2016 | Chen ................... | G11C 11/5628 |

* cited by examiner

*Primary Examiner* — Vu A Le
(74) *Attorney, Agent, or Firm* — Vierra Magen Marcus LLP

(57) ABSTRACT

An apparatus includes a plurality of NAND strings in a block with word lines connected to cells of the NAND strings and select lines connected to select gate transistors of the NAND strings. A control circuit is configured to, after a read operation of memory cells of the block apply substantially zero volts to the global word lines to discharge the word lines to substantially zero volts. The control circuit is further configured to turn off the select gate transistors to isolate channels, turn off the block select transistors to isolate the word lines from the global word lines, and with the block select transistors turned off, apply a low positive voltage on the global word lines.

20 Claims, 29 Drawing Sheets

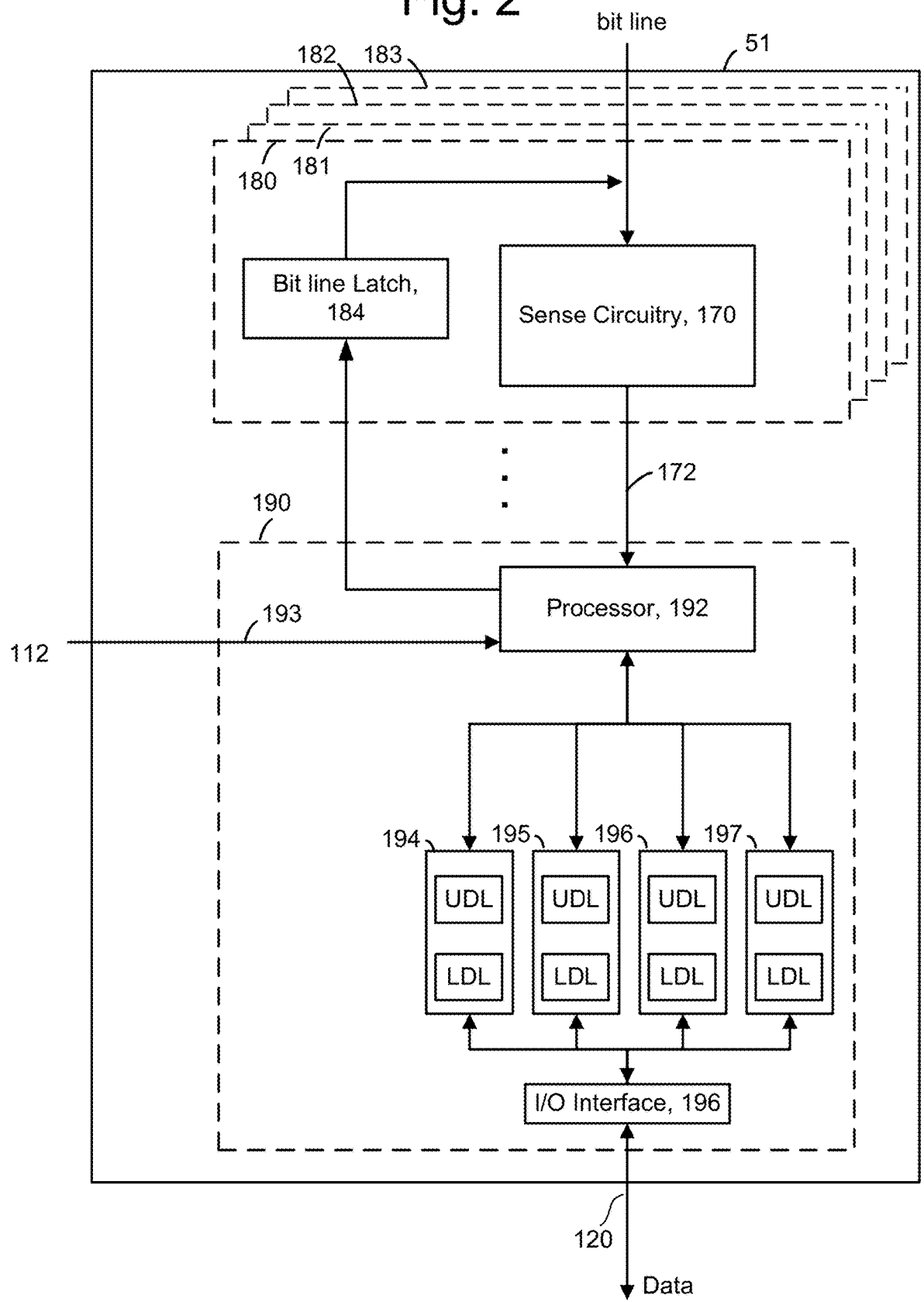

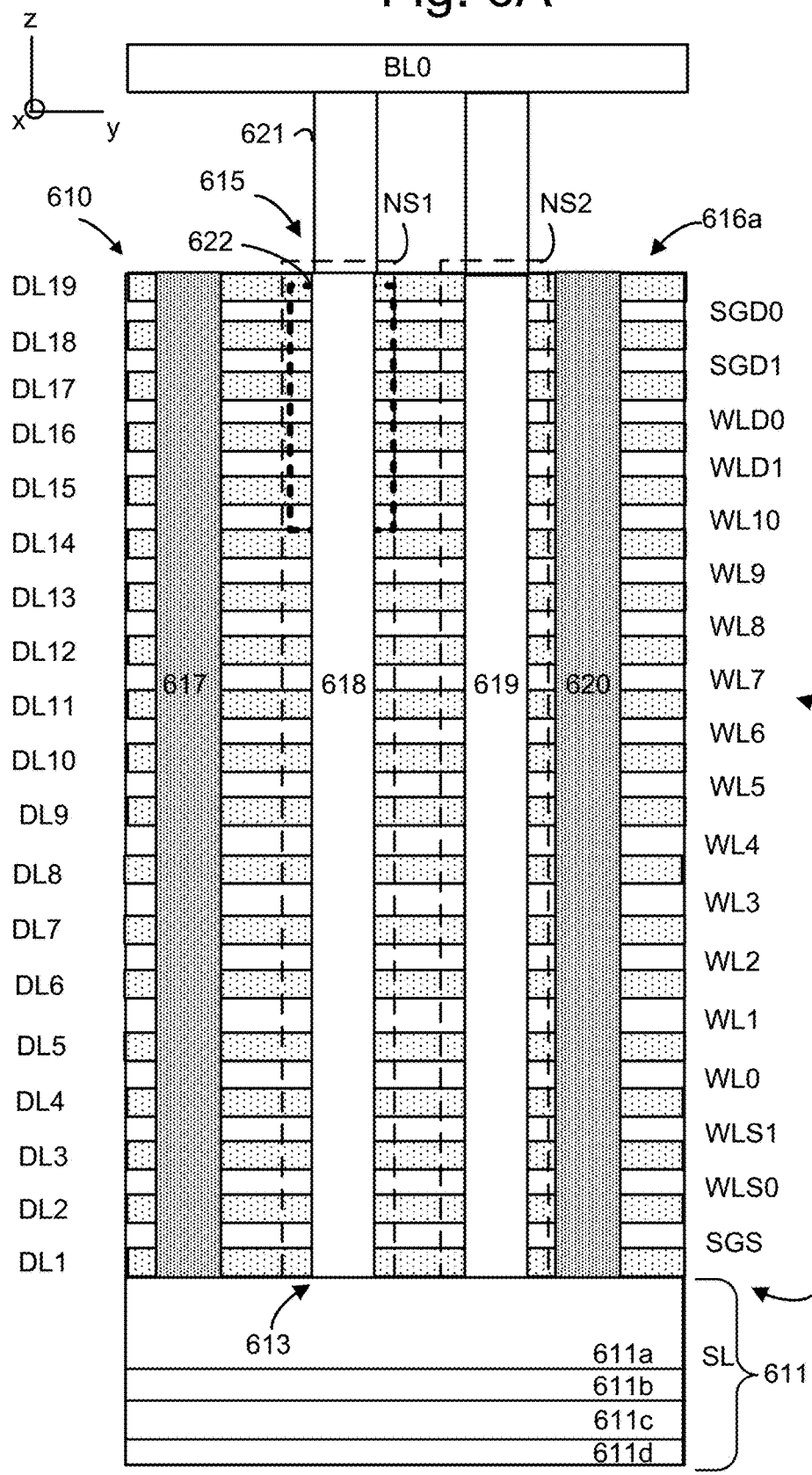
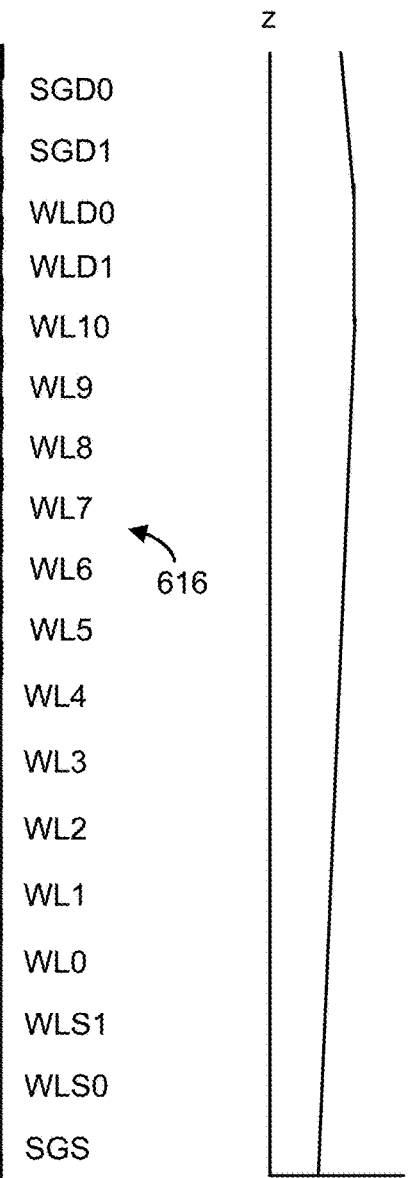
Fig. 6A
Fig. 6B

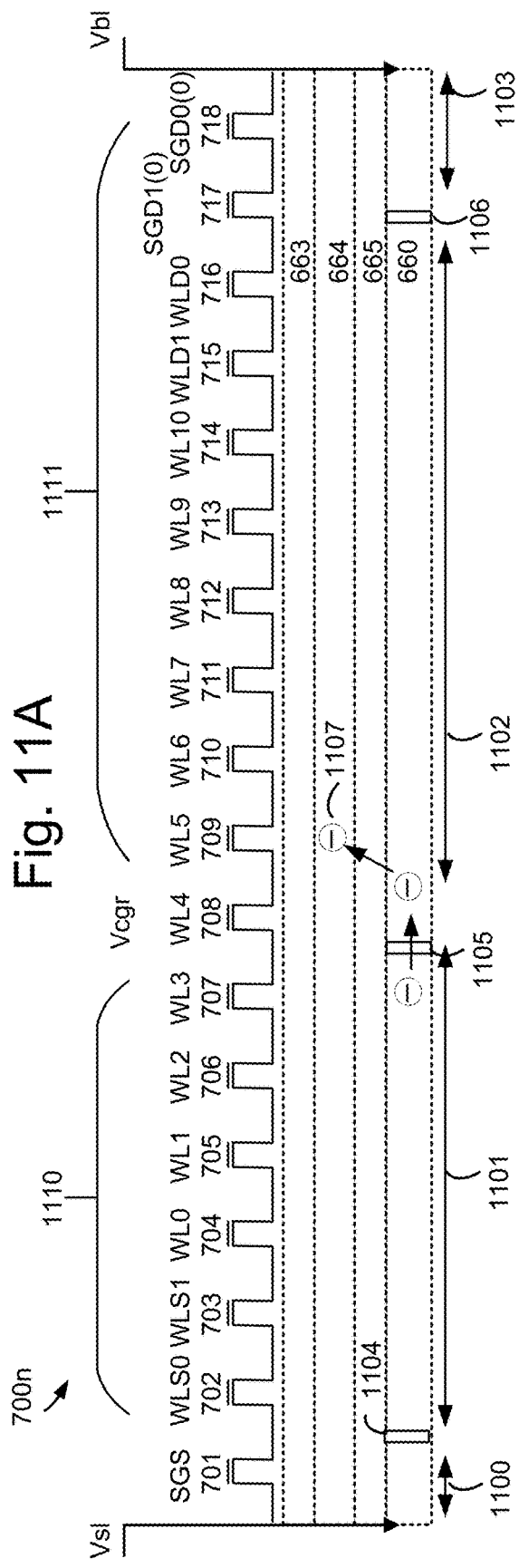

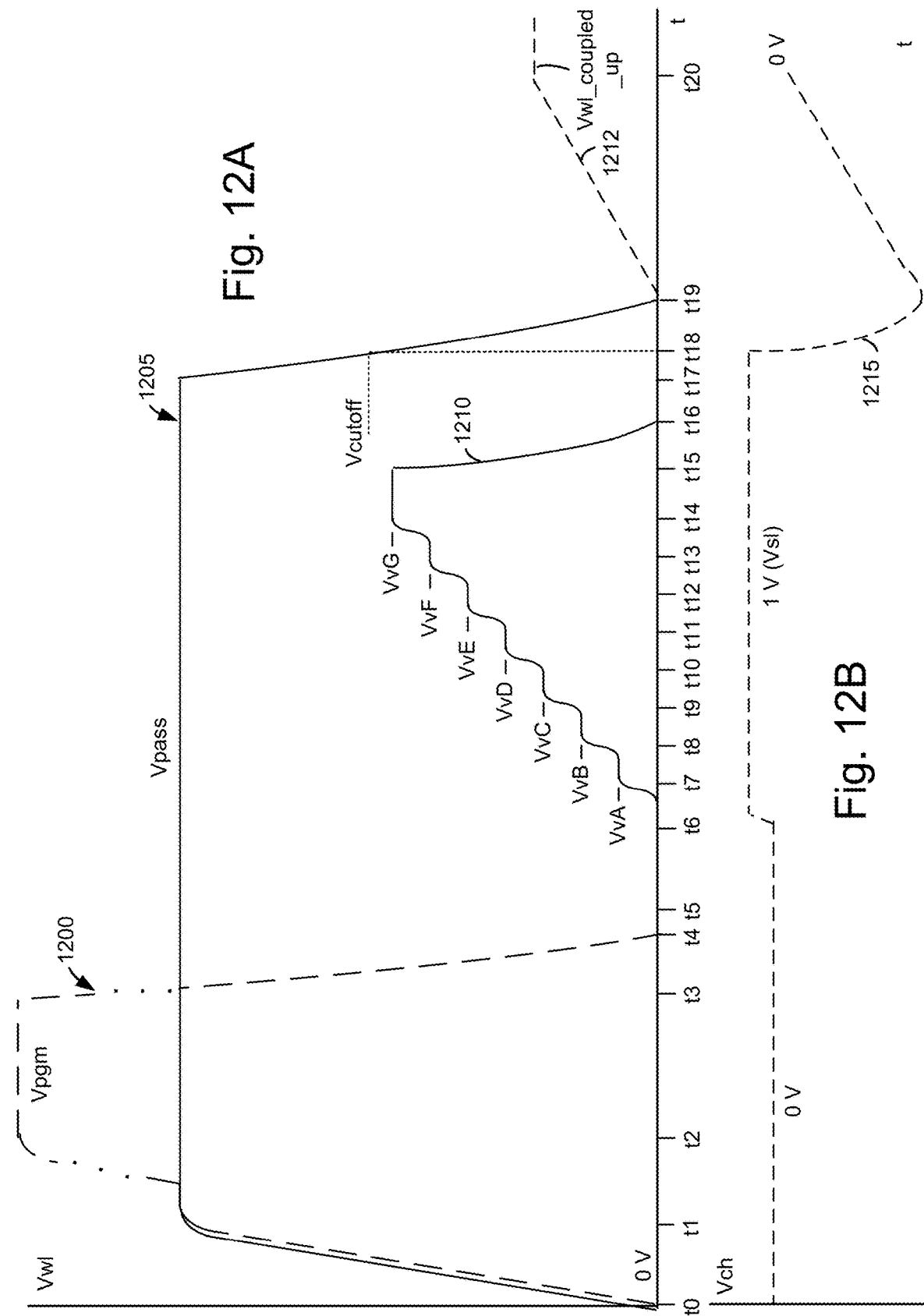

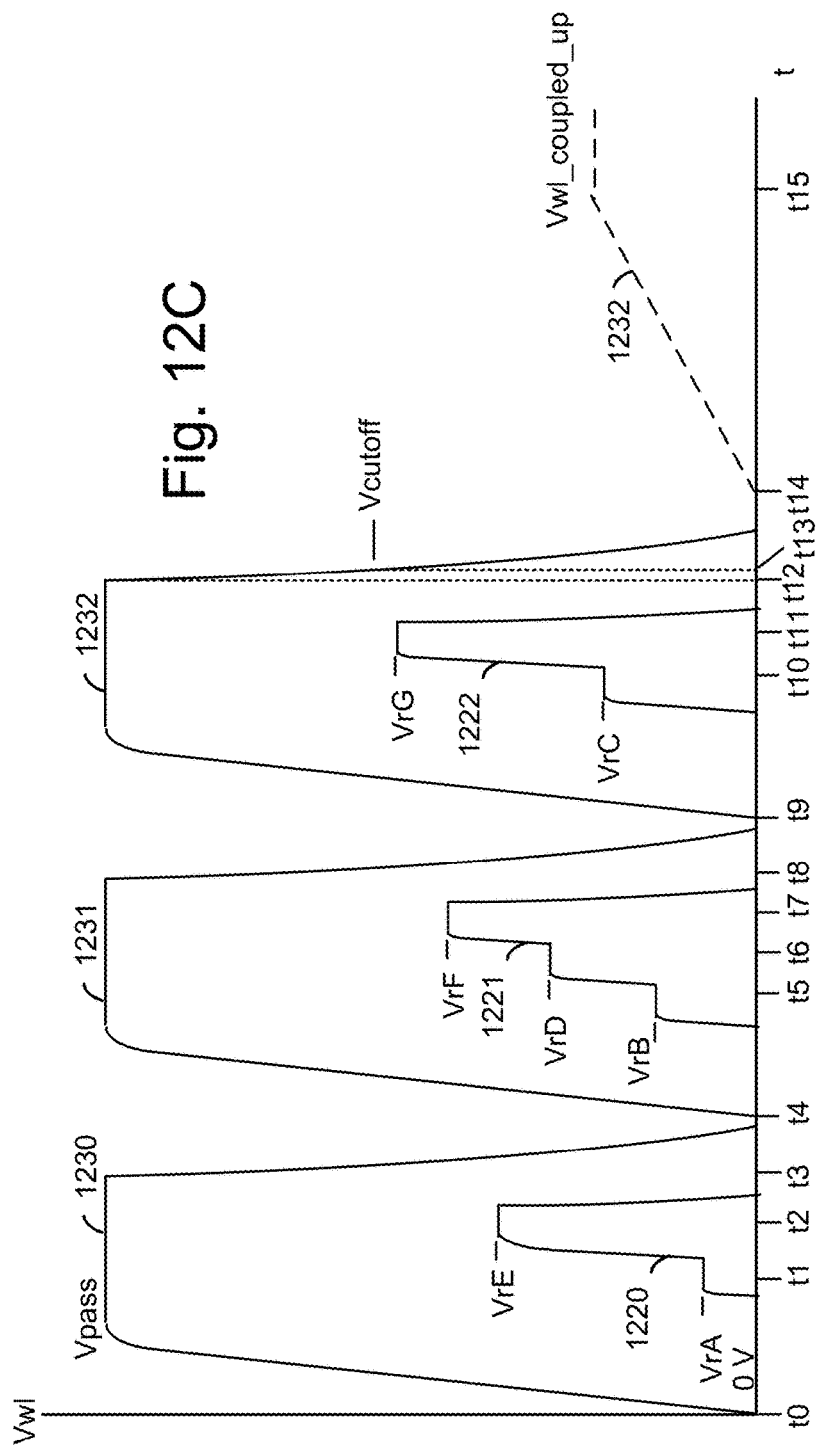
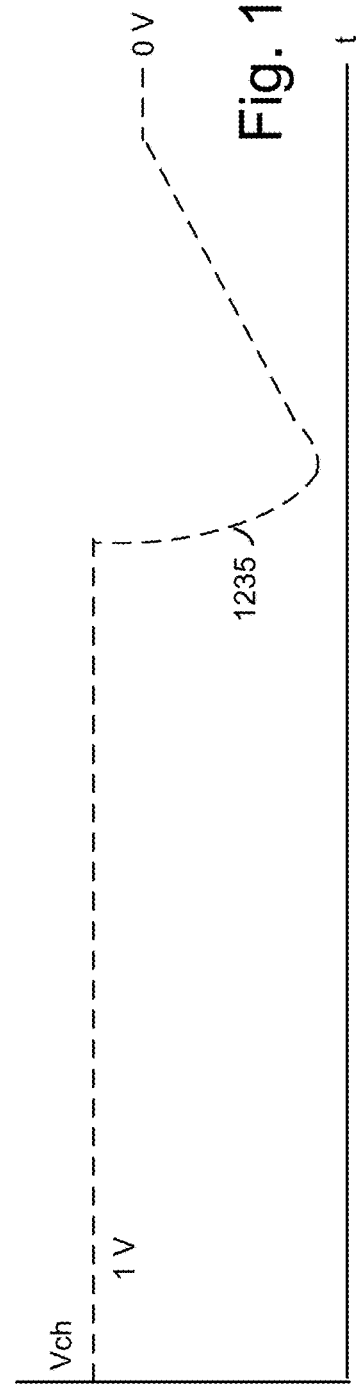

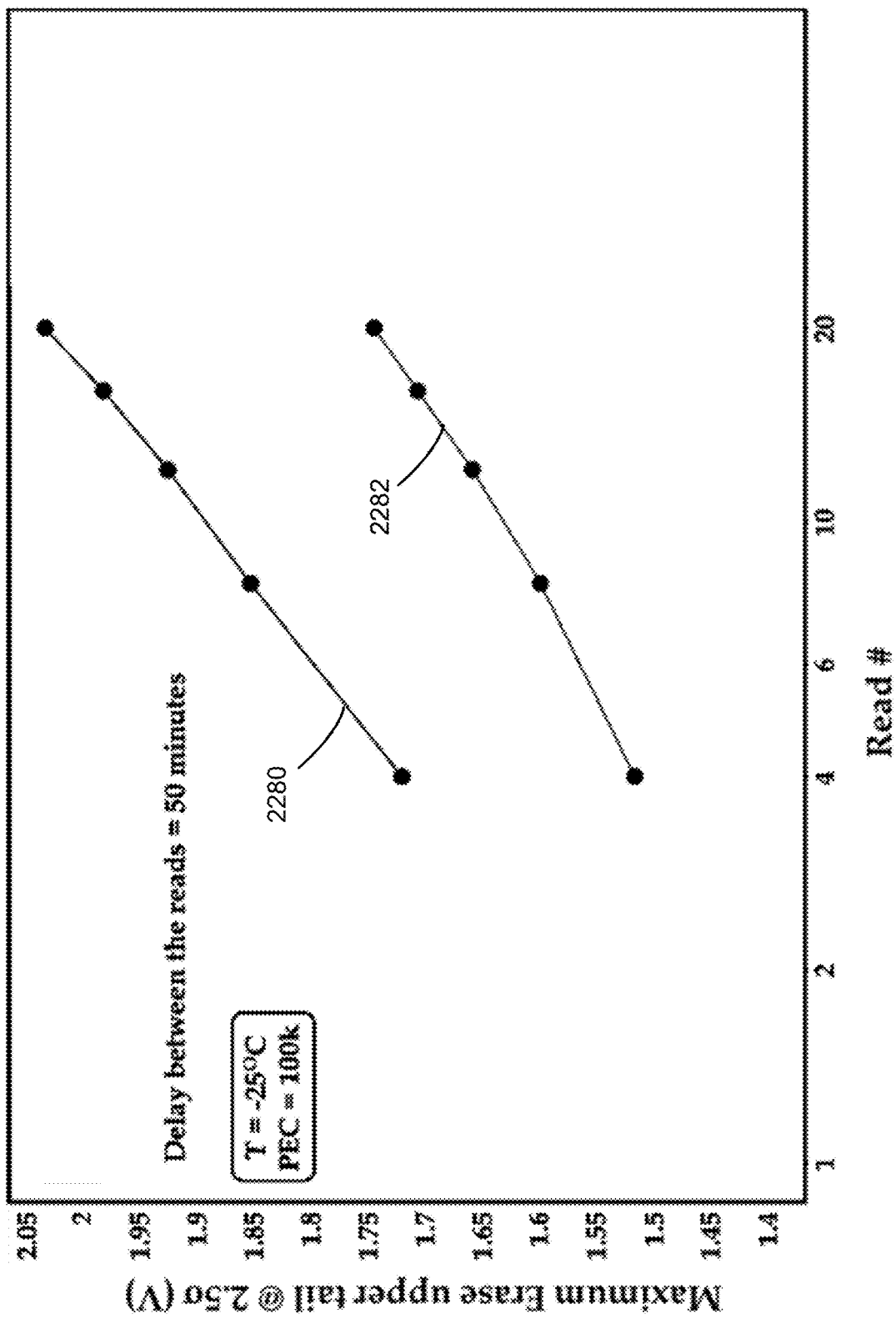

REDUCING POST-READ DISTURB IN A NONVOLATILE MEMORY DEVICE

CLAIM OF PRIORITY

The present application claims the benefit of U.S. Provisional Patent Application No. 62/804,889, filed on Feb. 13, 2019, which is hereby incorporated by reference in its entirety.

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings, for instance, where select gate transistors are provided at the ends of the NAND string to selectively connect a channel of the NAND string to a source line or bit line. However, various challenges are presented in operating such memory devices.

BRIEF DESCRIPTION OF THE DRAWINGS

FIG. 2 is a block diagram depicting one embodiment of the sense block 51 of FIG. 1.

FIG. 6A depicts an example cross-sectional view of a portion of one of the blocks of FIG. 5.

FIG. 6B depicts an example variation in the width of the memory holes of FIG. 6A along their height.

FIG. 11A depicts a plot of the NAND string 700n of FIG. 7, showing the movement of electrons during a read operation which cause a disturb.

FIG. 11B depicts a table showing control gate voltages of the memory cells and select gate transistors in FIG. 11A, (1a) before a read operation when the control gate voltages are floating and there is a first read situation, (1b) before a read operation when the control gate voltages are floating and there is a second read situation, (2) at a start of the read operation when the control gate voltages are at 0 V and (3) after the control gate voltages are increased to a level used for sensing.

FIG. 11C depicts a table showing voltages in the channel 660 of FIG. 11A for the case of a first read situation without an SGD control gate voltage pulse, consistent with FIG. 11B, rows 1a, 2 and 3.

FIG. 11D depicts a table showing voltages in the channel 660 of FIG. 11A for the case of a second read situation without an SGD control gate voltage pulse, consistent with FIG. 11B, rows 1b, 2 and 3.

FIG. 11E depicts a table showing voltages in the channel 660 of FIG. 11A for the case of a first read situation with an SGD control gate voltage pulse, consistent with FIG. 11B, rows 1a, 2 and 3.

FIG. 12A depicts a plot of example waveforms in a program operation, showing coupling up of a word line voltage.

FIG. 12B depicts a plot of a channel voltage (Vch) corresponding to FIG. 12A.

FIG. 12C depicts a plot of example waveforms in a read operation, showing coupling up of a word line voltage.

FIG. 12D depicts a plot of a channel voltage (Vch) corresponding to FIG. 12C.

FIG. 22 shows effects of postponing discharge of select gate control voltage SG.

DETAILED DESCRIPTION

Apparatuses and techniques are described for reducing disturbs of memory cells in a memory device including disturbs that may occur after a read operation.

In some memory devices, memory cells are joined to one another such as in NAND strings in a block or sub-block.

Each NAND string comprises a number of memory cells connected in series between one or more drain-end select gate transistors (referred to as SGD transistors), on a drain-end of the NAND string which is connected to a bit line, and one or more source-end select gate transistors (referred to as SGS transistors), on a source-end of the NAND string or other memory string or set of connected memory cells which is connected to a source line. Further, the memory cells can be arranged with a common control gate line (e.g., word line) which acts a control gate. A set of word lines extends from the source-side of a block to the drain-side of a block. Memory cells can be connected in other types of strings and in other ways as well.

In a 3D memory structure, the memory cells may be arranged in vertical memory strings in a stack, where the stack comprises alternating conductive and dielectric layers. The conductive layers act as word lines which are connected to the memory cells. Each memory string may have the shape of a pillar which intersects with the word lines to form the memory cells.

The memory cells can include data memory cells, which are eligible to store user data, and dummy or non-data memory cells which are ineligible to store user data. A dummy word line is connected to a dummy memory cell. One or more dummy memory cells may be provided at the drain and/or source ends of a string of memory cells to provide a gradual transition in the channel voltage gradient.

Figure 9:
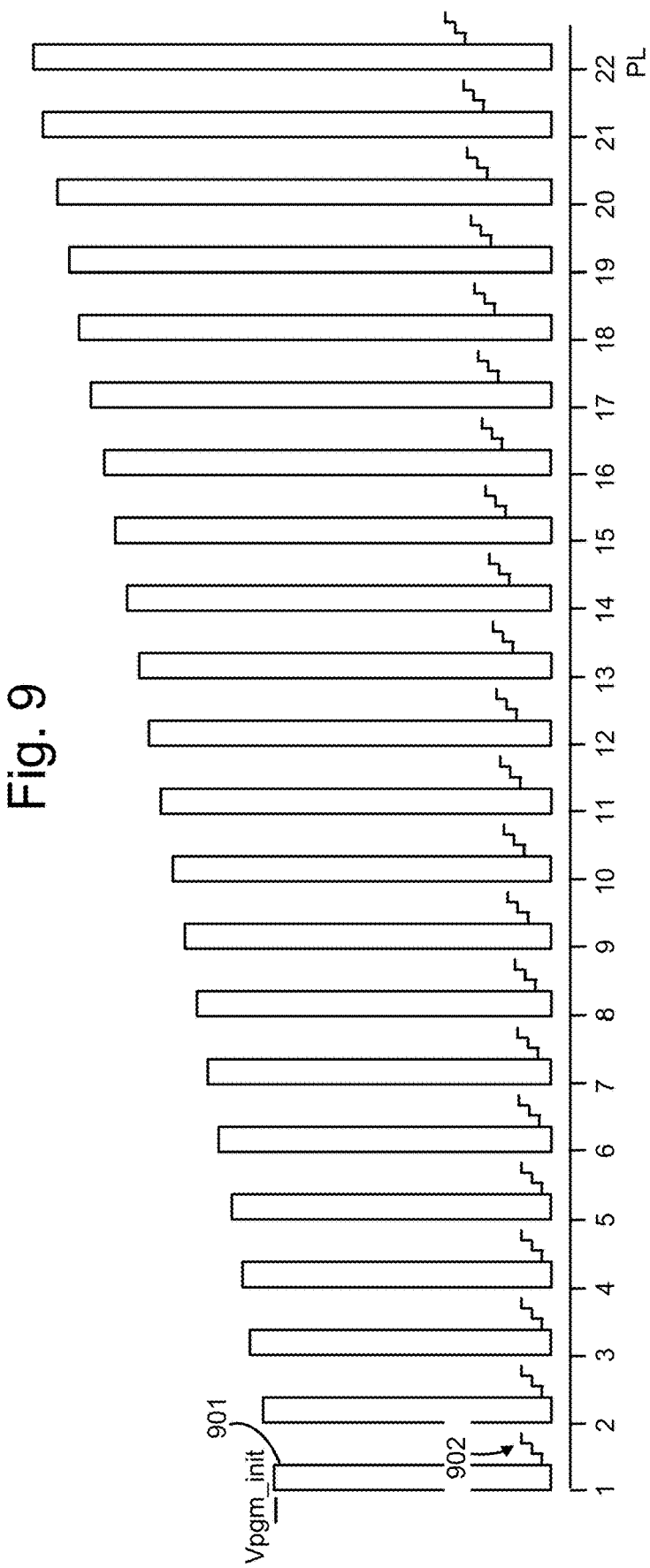
FIG. 9 depicts a voltage signal used in a series of program loops in an example program operation.

During a program operation, the memory cells are programmed according to a word line programming order. For example, the programming may start at the word line at the source-side of the block and proceed to the word line at the drain-side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a series of program loops or program-verify iterations, such as depicted in FIG. 9. Each program loop includes a program voltage followed by one or more verify voltages. The verify voltages are used in verify tests which determine whether the memory cells have completed programming to an assigned data state. When programming is completed for a memory cell, it can be locked out from further programming while programming continues for other memory cells in subsequent program loops.

The memory cells may also be programmed according to a sub-block programming order, where memory cells connected to a word line are programmed in one sub-block, then a next sub-block and so forth.

Each memory cell may be associated with an assigned data state according to write data in a program command. Based on its assigned data state, a memory cell will either remain in the erased state or be programmed to a programmed data state. For example, in a one bit per cell memory device, there are two data states including the erased state and the programmed state. In a two-bit per cell memory device, there are four data states including the erased state and three higher data states referred to as the A, B and C data states. In a three-bit per cell memory device, there are eight data states including the erased state and seven higher data states referred to as the A, B, C, D, E, F and G data states (see FIG. 10). In a four-bit per cell memory device, there are sixteen data states including the erased state and fifteen higher data states. The data states may be referred to as the S0-S15 data states where S0 is the erased state.

After the memory cells are programmed, the data can be read back in a read operation. A read operation can involve applying a series of read voltages to a word line while sensing circuitry determines whether cells connected to the word line are in a conductive or non-conductive state. If a cell is in a non-conductive state, the Vth of the memory cell exceeds the read voltage. The read voltages are set at levels which are expected to be between the threshold voltage (Vth) levels of adjacent data states. During the read operation, the voltages of the unselected word lines are ramped up to a read pass level which is high enough to place the unselected memory cells in a strongly conductive state, to avoid interfering with the sensing of the selected memory cells.

However, it has been observed that the Vth of the memory cells can increase due to disturbs such as those which occur in a read operation. Moreover, the likelihood of a disturb and the severity of a disturb, is a function of a floating (e.g., not driven) voltage of the word lines prior to a read operation. The floating voltage, in turn, is affected by factors including a time since a last sensing operation, whether a sensing operation has occurred since a most recent power on event of the memory device, and a temperature of the memory device. Generally, a lower floating voltage is associated with a greater amount of disturb for reasons discussed further in connection with FIG. 11A to 11E.

Sensing operations such as read and program-verify result in a coupling up of the word line voltages to a level such as 4 V, for reasons explained in connection with FIG. 12A to 12D. However, the word line voltages gradually decay back to 0 V during an idle time of the memory device, if no additional sensing operation is performed. The word line voltages can therefore be in a fully coupled up state, a discharged state or somewhere in between. Moreover, in some situations, the word line voltages are forced to 0 V. For example, after a power on event, e.g., when the memory device is powered up for use, an operation may occur which checks for bad blocks. This operation may involve applying 0 V or other low voltage to the word lines. As a result, any coupling up of the word line voltages is discharged.

A first read or cold read situation can be defined for a block of memory cells when the block is subject to a power on event and there has not yet been a sensing operation, or when sufficient time has passed since a sensing operation so that block components including word lines have discharged to substantially the condition of a newly powered on block. In the first read situation, the floating voltages of the word lines may decay to, or may be driven to, a level at or close to 0 V. A second or hot read situation can be defined for the block when the block has been subject to a sensing operation fairly recently such as a few minutes or less ago. In this situation, the floating voltages of the word line are at, or close to, their peak coupled up level.

After a read or operation, discharge of components such as word lines may cause some disturbance that increases with time. Reducing or eliminating such post-read disturbance may provide lower error rates (lower bit error rate, or BER) when stored data is read. Aspects of the present technology are directed to systems and methods of reducing or eliminating post-read disturbance of stored data in non-volatile memory.

Figure 1A:
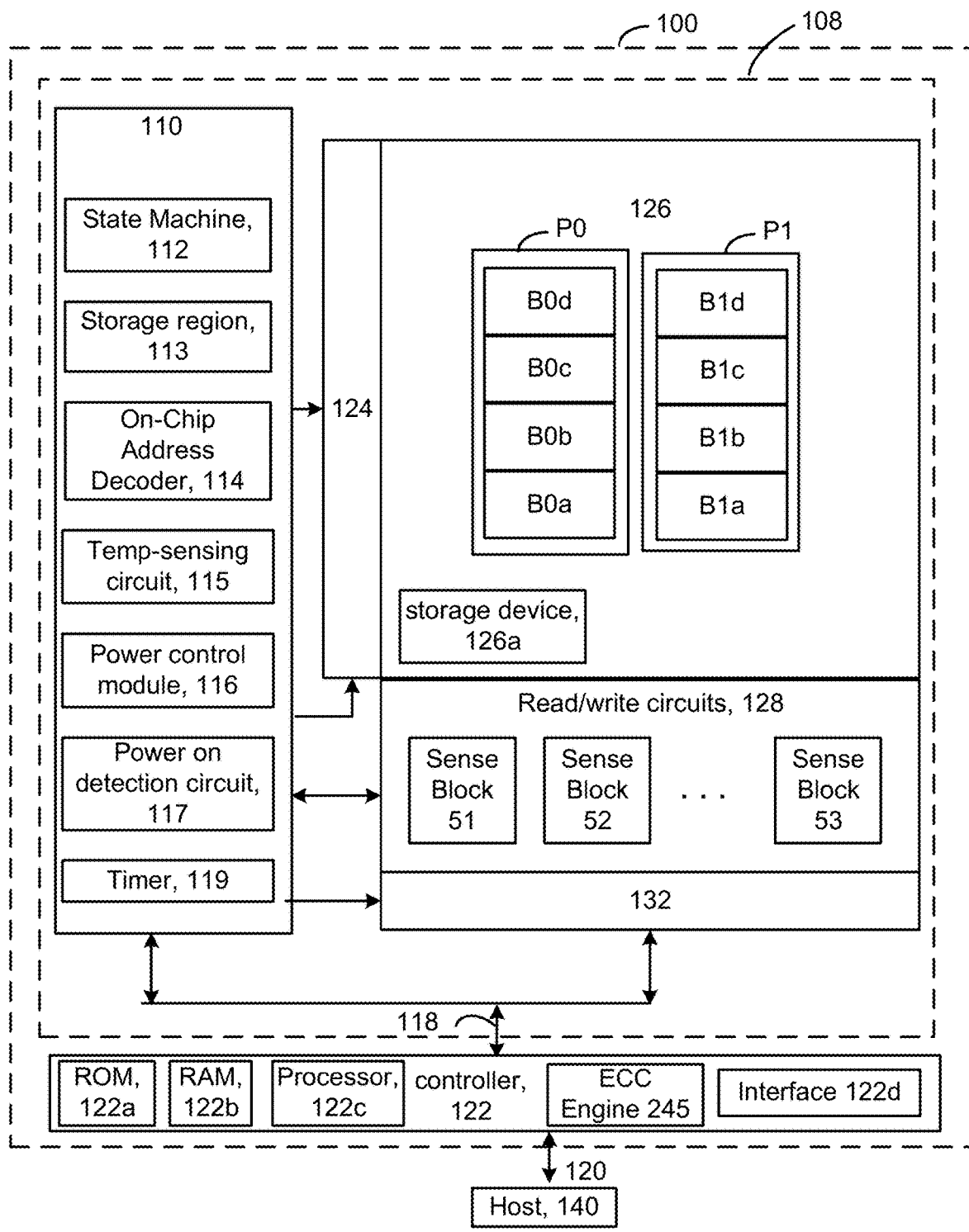
FIG. 1A is a block diagram of an example memory device comprising memory cells arranged in different planes.

FIG. 1A is a block diagram of an example memory device comprising memory cells arranged in different planes. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The memory structure 126 may comprise multiple planes, such as neighbor planes P0 and P1. Each plane may include one or more blocks of memory cells. For example, P0 includes blocks B0a-B0d and P1 includes blocks B1a-B1d.

The read/write circuits 128 include multiple sense blocks 51, 52, . . . 53 (sensing circuitry) and allow a page of memory cells to be read or programmed in parallel. Typically, a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, a temperature-sensing circuit 115, a power control module 116, a power on detection circuit 117 and a timer 119.

Figure 1B:
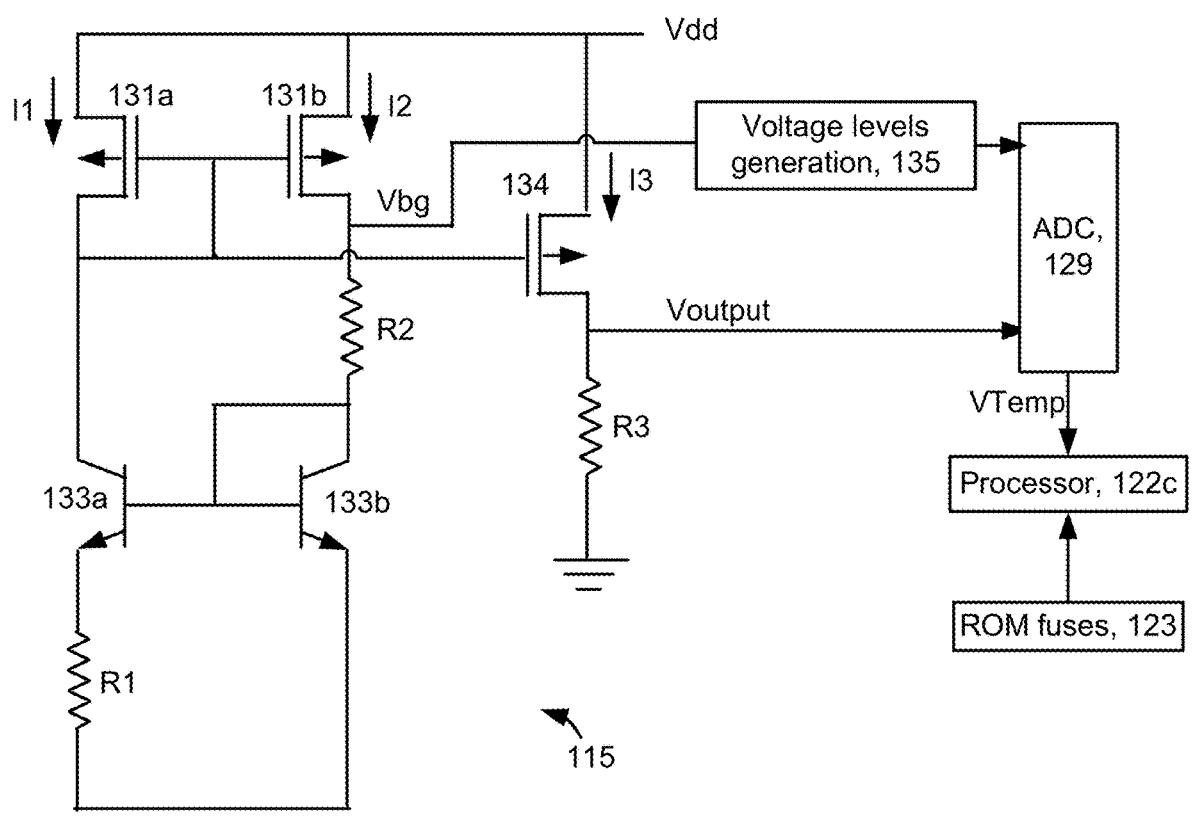
FIG. 1B depicts an example of the temperature-sensing circuit 115 of FIG. 1A.

The state machine 112 provides chip-level control of memory operations. A storage region 113 may be provided, e.g., for operational parameters and software/code. In one embodiment, the state machine is programmable by the software. In other embodiments, the state machine does not use software and is completely implemented in hardware (e.g., electrical circuits). The on-chip address decoder 114 provides an address interface between that used by the host or a memory controller to the hardware address used by the decoders 124 and 132. An indication of temperature which is obtained by the temperature-sensing circuit may be used to adjust a read operation, as described further below. FIG. 1B provides an example of a temperature-sensing circuit.

The power control module 116 controls the power and voltages supplied to the word lines, select gate lines, bit lines and source lines during memory operations. It can include drivers for data and dummy word lines, SGS and SGD transistors and source lines. See also FIG. 4. The sense blocks can include bit line drivers, in one approach. The power on detection circuit may be used to detect when the memory device has been powered on. The detection circuit may comprise an event handler which may be a software or firmware routine, or a routine implemented in hardware. The timer may be used to determine a time which has elapsed since a last read operation. The timer may increment based on a clock signal used in the memory device.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 116, sense blocks 51, 52, . . . , 53, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively, or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and select gate transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure. In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

FIG. 1B depicts an example of the temperature-sensing circuit 115 of FIG. 1A. The temperature-sensing circuit can be used to determine a temperature to set a duration and/or magnitude of a SGD control gate voltage pulse.

The circuit includes pMOSFETs 131a, 131b and 134, bipolar transistors 133a and 133b and resistors R1, R2 and R3. I1, I2 and I3 denote currents. Voutput is a temperature-based output voltage provided to an analog-to-digital (ADC) converter 129. Vbg is a temperature-independent voltage. A voltage level generation circuit 135 uses Vbg to set a number of voltage levels. For example, a reference voltage may be divided down into several levels by a resistor divider circuit.

The ADC compares Voutput to the voltage levels and selects a closest match among the voltage levels, outputting a corresponding digital value (VTemp) to the processor. This is data indicating a temperature of the memory device. ROM fuses 123 store data which correlates the matching voltage level to a temperature, in one approach. The processor then uses the temperature to set temperature-based parameters in the memory device.

Vbg, is obtained by adding the base-emitter voltage (Vbe) across the transistor 131$b$ and the voltage drop across the resistor R2. The bipolar transistor 133$a$ has a larger area (by a factor N) than the transistor 133$b$. The PMOS transistors 131$a$ and 131$b$ are equal in size and are arranged in a current mirror configuration so that the currents I1 and I2 are substantially equal. We have Vbg=Vbe+R2×I2 and I1=Ve/R1 so that I2=Ve/R1. As a result, Vbg=Vbe+R2×kT ln(N)/R1×q, where T is temperature, k is Boltzmann's constant and q is a unit of electric charge. The source of the transistor 134 is connected to a supply voltage Vdd and the node between the transistor's drain and the resistor R3 is the output voltage, Voutput. The gate of the transistor 134 is connected to the same terminal as the gates of transistors 131$a$ and 131$b$ and the current through the transistor 134 mirrors the current through the transistors 131$a$ and 131$b$.

FIG. 2 is a block diagram depicting one embodiment of the sense block 51 of FIG. 1. An individual sense block 51 is partitioned into one or more core portions, referred to as sense circuits 180-183 or sense amplifiers, and a common portion, referred to as a managing circuit 190. In one embodiment, there will be a separate sense circuit for each bit line/NAND string and one common managing circuit 190 for a set of multiple, e.g., four or eight, sense circuits. Each of the sense circuits in a group communicates with the associated managing circuit via data bus 172. Thus, there are one or more managing circuits which communicate with the sense circuits of a set of storage elements.

The sense circuit 180, as an example, comprises sense circuitry 170 that performs sensing by determining whether a conduction current in a connected bit line is above or below a predetermined threshold level. Sense circuit 180 also includes a bit line latch 184 that is used to set a voltage condition on the connected bit line. For example, a predetermined state latched in the bit line latch will result in the connected bit line being pulled to a state designating program inhibit (e.g., 1.5-3 V). As an example, a flag=0 can inhibit programming, while flag=1 does not inhibit programming.

The managing circuit 190 comprises a processor 192, four example sets of data latches 194-197 and an I/O Interface 196 coupled between the set of data latches 194 and data bus 120. One set of data latches, e.g., LDL and UDL, can be provided for each sense circuit. In some cases, additional data latches may be used. LDL stores a bit for a lower page of data, and UDL stores a bit for an upper page of data. This is in a four-level or two-bits per storage element memory device. One additional data latch per bit line can be provided for each additional data bit per storage element.

The processor 192 performs computations, such as to determine the data stored in the sensed storage element and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed storage element. As it steps through the various predefined control gate voltages corresponding to the various memory states supported by the memory, the sense circuit 180 may trip at one of these voltages and a corresponding output will be provided from sense circuit 180 to processor 192 via bus 172. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197. In another embodiment of the managing circuit 190, bit line latch serves double duty, both as a latch for latching the output of the sense circuit 180 and also as a bit line latch as described above.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120, in the LDL and UDL latches, in a two-bit per storage element implementation. In a three-bit per storage element implementation, an additional data latch may be used. The program operation, under the control of the state machine, comprises a series of programming voltage pulses applied to the control gates of the addressed storage elements. Each program voltage is followed by a read back (verify) to determine if the storage element has been programmed to the desired memory state. In some cases, processor 192 monitors the read back memory state relative to the desired memory state. When the two are in agreement, the processor 192 sets the bit line latch so as to cause the bit line to be pulled to a state designating program inhibit. This inhibits the storage element coupled to the bit line from further programming even if program pulses appear on its control gate. In other embodiments the processor initially loads the bit line latch and the sense circuitry sets it to an inhibit value during the verify process.

Each set of data latches 194-197 may be implemented as a stack of data latches for each sense circuit. In one embodiment, there are three data latches per sense circuit 180. In some implementations, the data latches are implemented as a shift register so that the parallel data stored therein is converted to serial data for data bus 120, and vice versa. All the data latches corresponding to the read/write block of storage elements can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated storage element has reached certain mileposts in a program operations. For example, latches may identify that a storage element's Vth is below a particular verify level. The data latches indicate whether a storage element currently stores one or more bits from a page of data. For example, the LDL latches can be used to store a lower page of data. An LDL latch is flipped (e.g., from 0 to 1) when a lower page bit is stored in an associated storage element. A UDL latch is flipped when an upper page bit is stored in an associated storage element. This occurs when an associated storage element completes programming, e.g., when its Vth exceeds a target verify level such as VvA, VvB or VvC.

Figure 3:
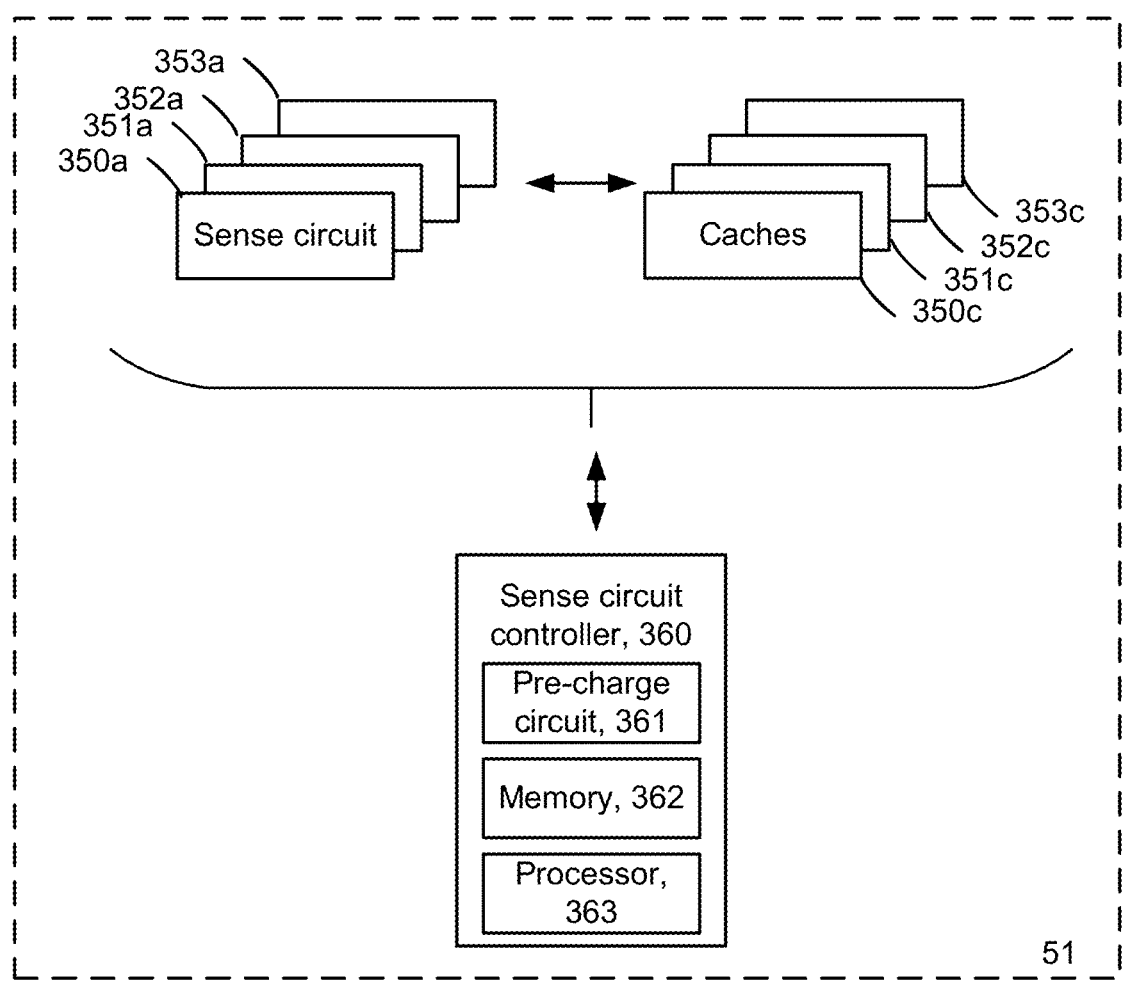
FIG. 3 depicts another example block diagram of the sense block 51 of FIG. 1.

FIG. 3 depicts another example block diagram of the sense block 51 of FIG. 1. The column control circuitry can include multiple sense blocks, where each sense block performs sensing, e.g., read, program verify or erase verify operations for multiple memory cells via respective bit lines. In one approach, a sense block comprises multiple sense circuits, also referred to as sense amplifiers. Each sense circuit is associated with data latches and caches. For example, the example sense circuits 350a, 351a, 352a and 353a are associated with caches 350c, 351c, 352c and 353c, respectively.

In one approach, different subsets of bit lines can be sensed using different respective sense blocks. This allows the processing load which is associated with the sense circuits to be divided up and handled by a respective processor in each sense block. For example, a sense circuit controller 360 can communicate with the set, e.g., sixteen, of sense circuits and latches. The sense circuit controller may include a pre-charge circuit 361 which provides a voltage to each sense circuit for setting a pre-charge voltage. The sense circuit controller may also include a memory 362 and a processor 363.

Figure 4:
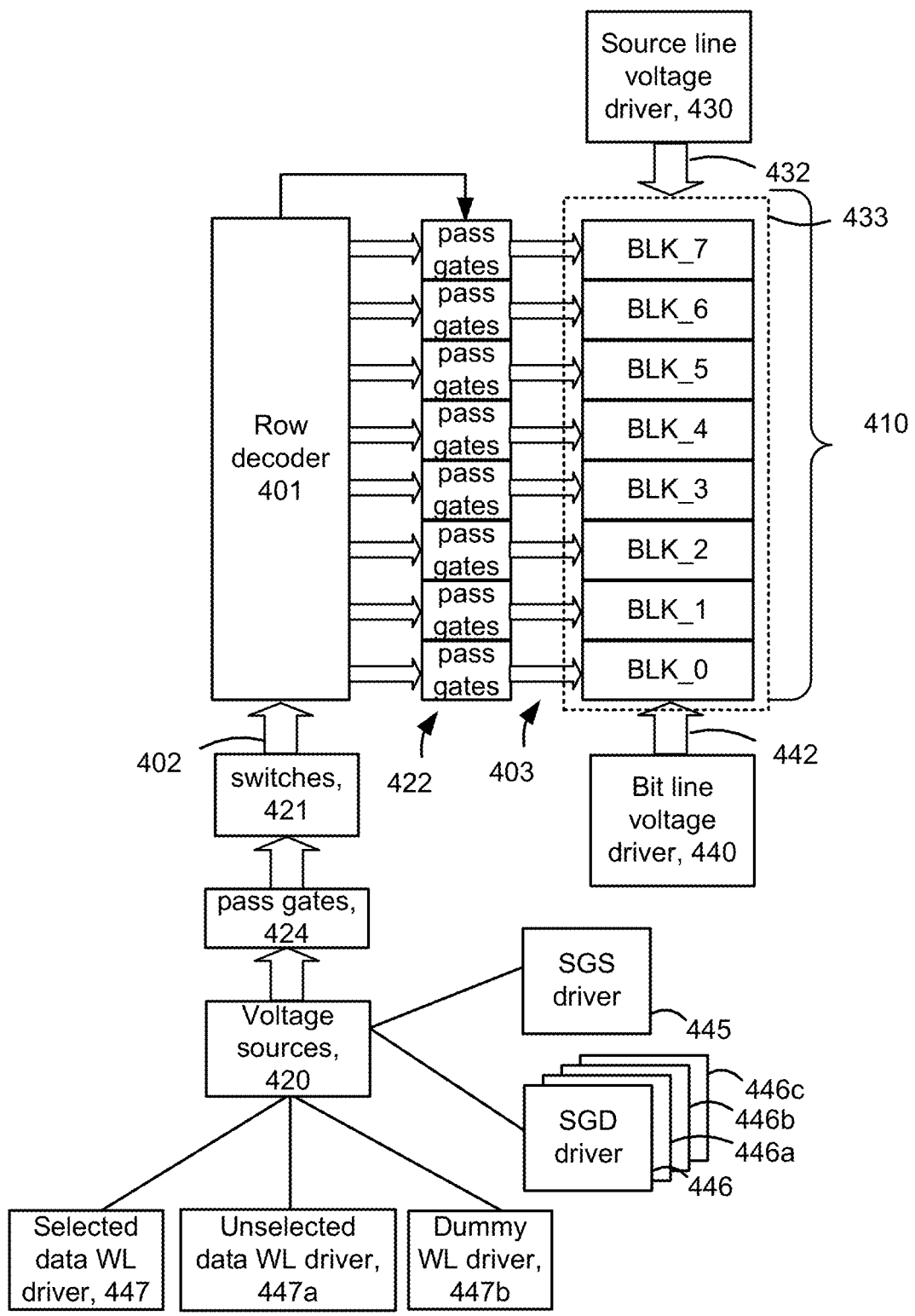
FIG. 4 depicts an example circuit for providing voltages to blocks of memory cells.

FIG. 4 depicts an example circuit for providing voltages to blocks of memory cells. In this example, a row decoder 401 provides voltages to word lines and select gates of each block in set of blocks 410. The blocks could be in a plane and includes blocks BLK_0 to BLK_7. The row decoder provides a control signal to pass transistors 422 which connect the blocks to the row decoder. Typically, program or read operations are performed on one selected block at a time and on one selected sub-block of the block. An erase operation may be performed on a selected block or sub-block. The row decoder and pass gates can connect global control lines 402 to local control lines 403. The control lines represent conductive paths. Voltages are provided on the global control lines from voltage sources 420 to pass transistors 422. The voltage sources may provide voltages to switches 421 which connect to the global control lines. Pass transistors 424 are controlled to pass voltages from the voltage sources 420 to the switches 421.

The voltage sources 420 can provide voltages on word lines (WL), SGS control gates and SGD control gates, for example. The voltage sources can include a selected word line (WL) driver 447, which provides a voltage on a word line selected during a program or read operation, a driver 447a for unselected data word lines, and a dummy word line driver 447b which provides voltages on dummy word lines.

The voltage sources can also include a common SGS driver 445 and separate SGD drivers for each sub-block. For example, SGD drivers 446, 446a, 446b and 446c can be provided for SB0, SB1, SB2 and SB3, respectively. In another option, a separate SGS driver is provided for each sub-block.

The various components, including the row decoder, may receive commands from a controller such as the state machine 112 or the controller 122 to perform the functions described herein.

A source line voltage source 430 provides the voltage Vsl to the source lines/diffusion region in the substrate via control lines 432. In one approach, the source diffusion region 433 is common to the blocks. A set of bit lines 442 is also shared by the blocks. A bit line voltage source 440 provides voltages to the bit lines.

Figure 5:
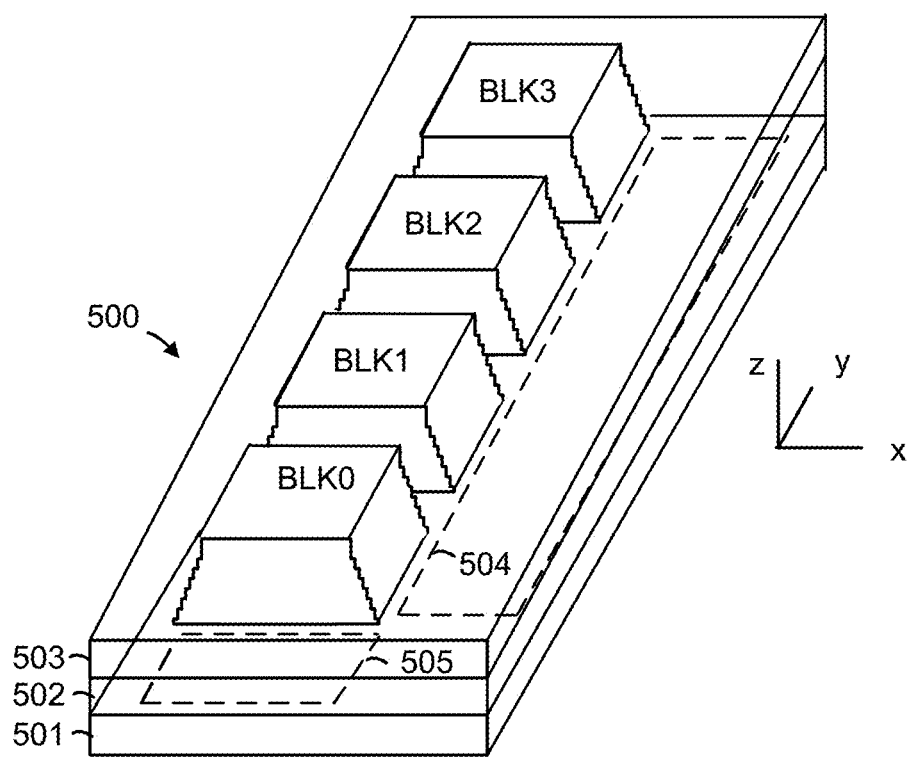
FIG. 5 is a perspective view of a memory device 500 comprising a set of blocks in an example 3D configuration of the memory structure 126 of FIG. 1.

FIG. 5 is a perspective view of a memory device 500 comprising a set of blocks in an example 3D configuration of the memory structure 126 of FIG. 1A. On the substrate are example blocks BLK0, BLK1, BLK2 and BLK3 of memory cells (storage elements) and peripheral areas with circuitry for use by the blocks. The peripheral area 504 runs along an edge of each block while the peripheral area 505 is at an end of the set of blocks. The pass transistors for a voltage driver of the SGS transistors may be located in this peripheral area 505, in one approach. In this case, the blocks BLK0, BLK1, BLK2 and BLK3 are at progressively further distances from the pass transistors. The circuitry can include voltage drivers which can be connected to control gate layers, bit lines and source lines of the blocks. In one approach, control gate layers at a common height in the blocks are commonly driven. The substrate 501 can also carry circuitry under the blocks, and one or more lower metal layers which are patterned in conductive paths to carry signals of the circuitry. The blocks are formed in an intermediate region 502 of the memory device. In an upper region 503 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

FIG. 6A depicts an example cross-sectional view of a portion of one of the blocks of FIG. 5. The block comprises a stack 610 of alternating conductive and dielectric layers. In this example, the conductive layers comprise two SGD layers, one SGS layer, two source-side dummy word line layers (or word lines) WLS1 and WLS0, two drain-side dummy word line layers WLD1 and WLD0, and eleven data word line layers (or data word lines) WL0-WL10. WL0 is a source-side data word line and WLS1 is a dummy word line layer which is adjacent to the source-side data word line.

WLS0 is another dummy word line layer which is adjacent to WLS1. WL10 is a drain-side data word line and WLD1 is a dummy word line layer which is adjacent to the drain-side data word line. WLD0 is another dummy word line layer which is adjacent to WLD1. The dielectric layers are labelled as DL1-DL19. Further, regions of the stack which comprise NAND strings NS1 and NS2 are depicted. Each NAND string encompasses a memory hole 618 or 619 which is filled with materials which form memory cells adjacent to the word lines. Region 622 of the stack is shown in greater detail in FIG. 6C.

The stack includes a substrate 611. In one approach, a portion of the source line SL comprises an n-type source diffusion layer 611a in the substrate which is in contact with a source end of each string of memory cells in a block. An erase voltage may be applied to this layer in an erase operation The n-type source diffusion layer 611a is formed in a p-type well region 611b, which in turn is formed in an n-type well region 611c, which in turn is formed in a p-type semiconductor substrate 611d, in one possible implementation. The n-type source diffusion layer may be shared by all of the blocks in a plane, in one approach.

NS1 has a source-end 613 at a bottom 616b of the stack 616 and a drain-end 615 at a top 616a of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage drivers.

FIG. 6B depicts an example variation in the width of the memory holes of FIG. 6A along their height. Due to the etching process used to create the memory holes, and the very high aspect ratio, the cross-sectional width, e.g., diameter, of a memory hole can vary along its height. Typically, the diameter becomes progressively smaller from the top to the bottom of the memory hole. In some case, a slight narrowing occurs at the top of the hole, as depicted, so that the diameter becomes slight wider before becoming progressively smaller from the top to the bottom of the memory hole.

Due to the non-uniformity in the width of the memory hole, and the corresponding width of the vertical pillar which is formed in the memory hole, the programming and erase speed of the memory cells can vary based on their position along the memory hole, e.g., based on their height in the stack. With a smaller diameter memory hole, the electric field across the tunneling layer is stronger, so that the programming and erase speed is higher.

In this case, the memory cells are arranged along vertically-extending memory holes in the memory device, and a width of the vertically-extending memory holes varies along a height of the memory device. Further, this example shows that the memory hole is created by etching through the stack of layers which include word line layers and select gate layers. In one variation, the word line layers are etched through before the SGD layers are deposited and subsequently etched through separately. In another variation, one set of word line layers is deposited and etched through, then another set of word line layers is deposited and etched through. The memory hole diameter can differ from that shown in these different variations.

Figure 6C:
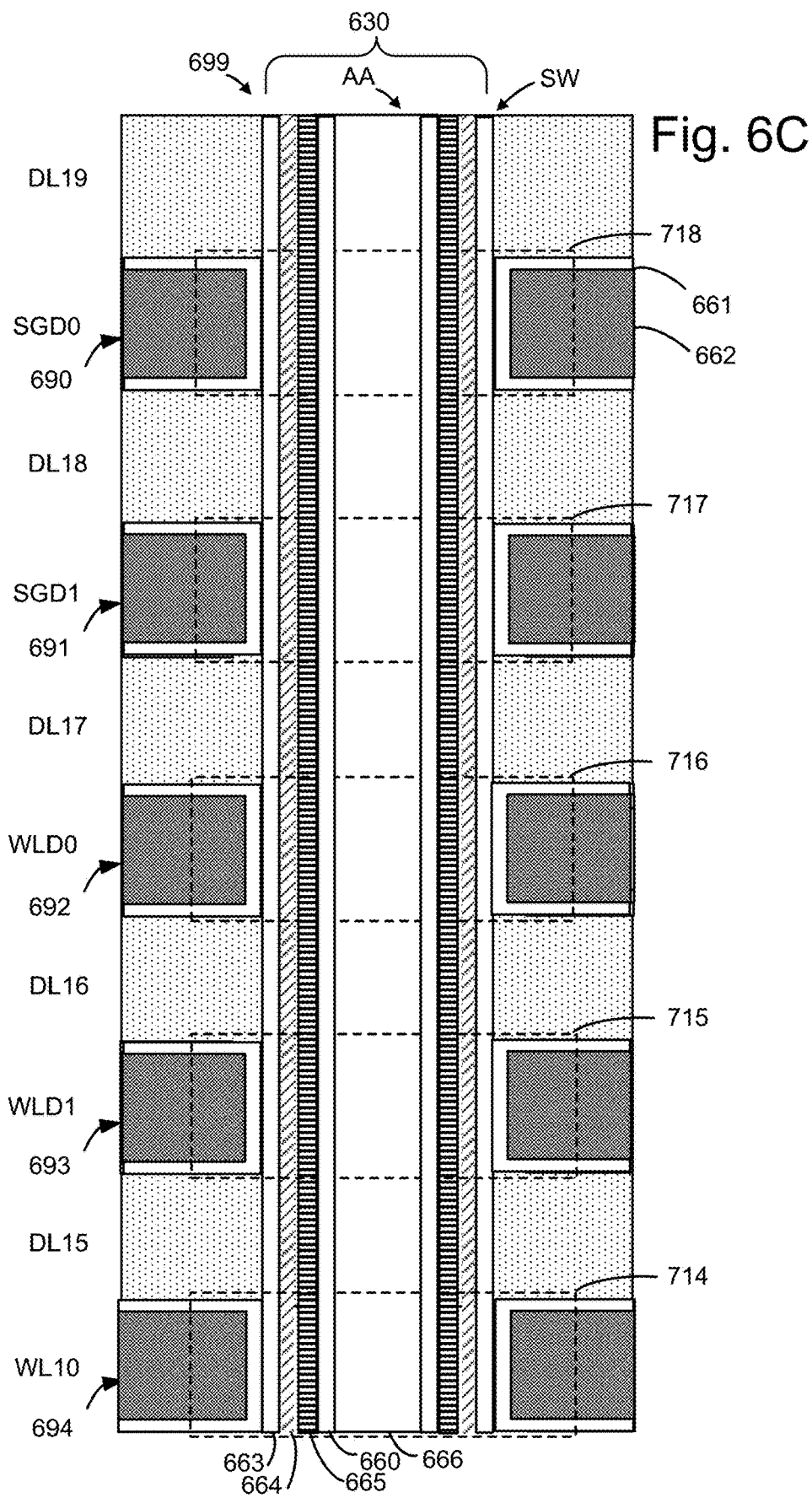
FIG. 6C depicts a close-up view of the region 622 of the stack of FIG. 6A.

FIG. 6C depicts a close-up view of the region 622 of the stack of FIG. 6A. Memory cells are formed at the different levels of the stack at the intersection of a word line layer and a memory hole. In this example, SGD transistors 718 and 717 are provided above dummy memory cells 716 and 715 and a data memory cell 714. A number of layers can be deposited along the sidewall (SW) of the memory hole 630 and/or within each word line layer, e.g., using atomic layer deposition. For example, each pillar 699 or column which is formed by the materials within a memory hole can include a blocking oxide layer 663, a charge-trapping layer 664 or film such as silicon nitride (Si3N4) or other nitride, a tunneling layer 665, a channel 660 (e.g., comprising polysilicon), and a dielectric core 666. A word line layer can include a metal barrier 661 and a conductive metal 662 such as Tungsten as a control gate. For example, control gates 690-694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

Each NAND string comprises a channel which extends continuously from one or more source-end select gate transistors to one or more drain-end select gate transistors.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

The movement of electrons in the channel during a read operation is discussed further in connection with FIG. 11A.

Figure 7:
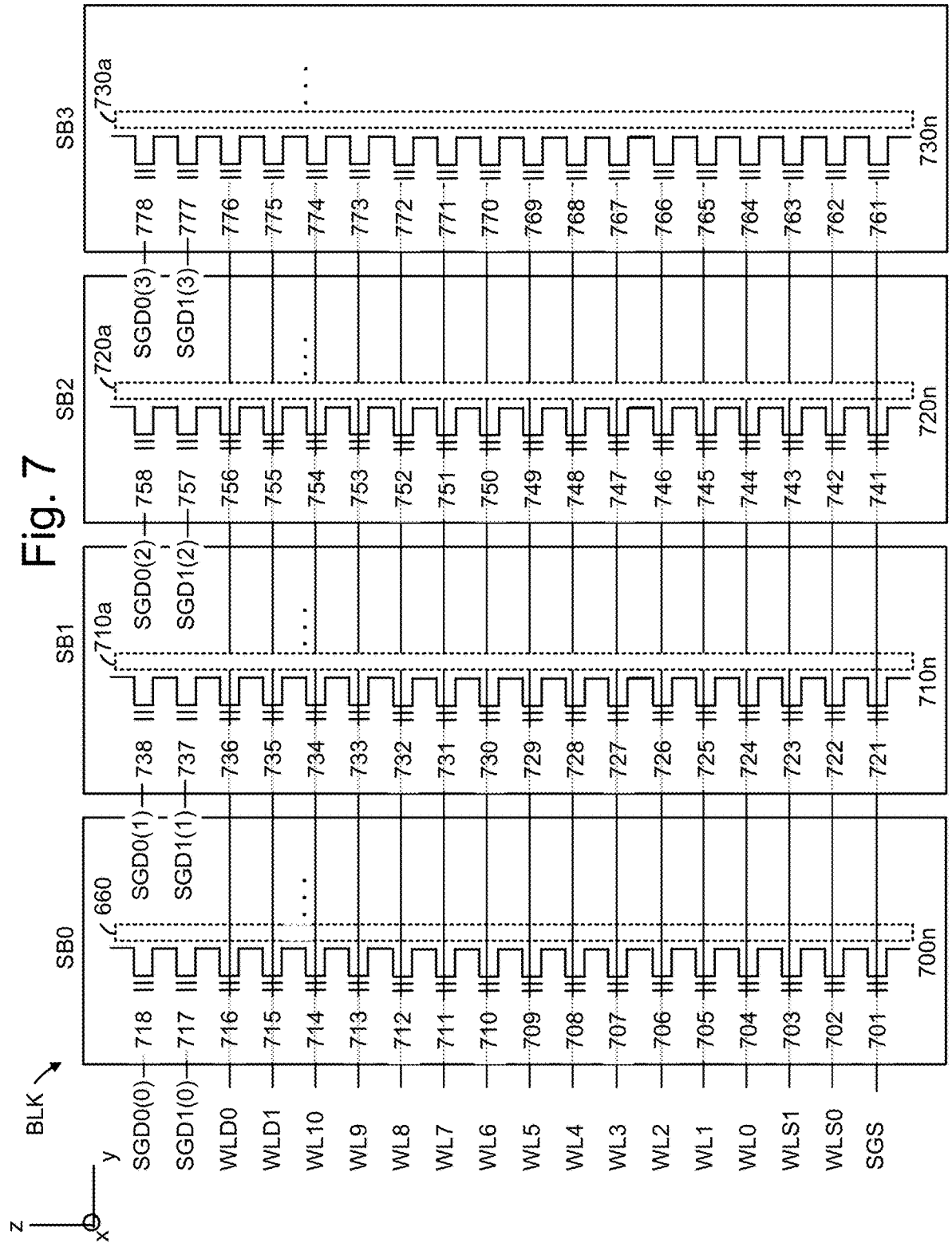
FIG. 7 depicts an example view of NAND strings in sub-blocks in a 3D configuration which is consistent with FIGS. 6A and 6C.

FIG. 7 depicts an example view of NAND strings in sub-blocks in a 3D configuration which is consistent with FIGS. 6A and 6C. A NAND string is one example of a set of connected memory cells such as series-connected memory cells. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 6A. Each sub-block comprises a set of NAND strings which extend in the x direction and which have a common SGD line. For simplicity, only one NAND string per sub-block is depicted in FIG. 7. Programming of the block may occur based on a word line programming order. Moreover, one option is to program the memory cells in different portions of a word line which are in the different sub-blocks, one sub-block at a time, before programming the memory cells of the next word line.

Another option programs all of the memory cells in one sub-block, one word line at a time, before programming the memory cells of the next sub-block. The word line programming order may start at WL0, the source-end word line, and end at WL10, the drain-end word line, for example.

The NAND strings 700n, 710n, 720n and 730n have channels 660 (FIG. 6C), 710a, 720a and 730a, respectively.

Additionally, NAND string 700n includes SGS transistor 701, source-side dummy memory cells 702 and 703, data memory cells 704, 705, 706, 707, 708, 709, 710, 711, 712, 713 and 714, drain-side dummy memory cells 715 and 716, and SGD transistors 717 and 718.

The memory cell 714 is an example of an edge data memory cell at the drain end of a NAND string, and the memory cell 704 is an example of an edge data memory cell at the source end of a NAND string.

NAND string 710n includes SGS transistor 721, source-side dummy memory cells 722 and 723, data memory cells 724, 725, 726, 727, 728, 729, 730, 731, 732, 733 and 734, drain-side dummy memory cells 735 and 736, and SGD transistors 737 and 738.

NAND string 720n includes SGS transistor 741, source-side dummy memory cells 742 and 743, data memory cells 744, 745, 746, 747, 748, 749, 750, 751, 752, 753 and 754, drain-side dummy memory cells 755 and 756, and SGD transistors 757 and 758.

NAND string 730n includes SGS transistor 761, source-side dummy memory cells 762 and 763, data memory cells 764, 765, 766, 767, 768, 769, 770, 771, 772, 773 and 774, drain-side dummy memory cells 775 and 776, and SGD transistors 777 and 778.

One or more SGD transistors are provided at the drain-end of each NAND string, and one or more SGS transistors are provided at the source-end of each NAND string. The SGD transistors in SB0, SB1, SB2 and SB3 may be driven by separate control lines SGD0(0) and SGD1(0), SGD0(1) and SGD1(1), SGD0(2) and SGD1(2), and SGD0(3) and SGD1(3), respectively, in one approach. In another approach, all of the SGD transistors in a sub-block are connected and commonly driven. The SGS transistors in SB0, SB1, SB2 and SB3 are driven by a common control line SGS, in one approach. In another possible approach, the SGS transistors in SB0, SB1, SB2 and SB3 may be driven by separate control lines.

Figure 8A:
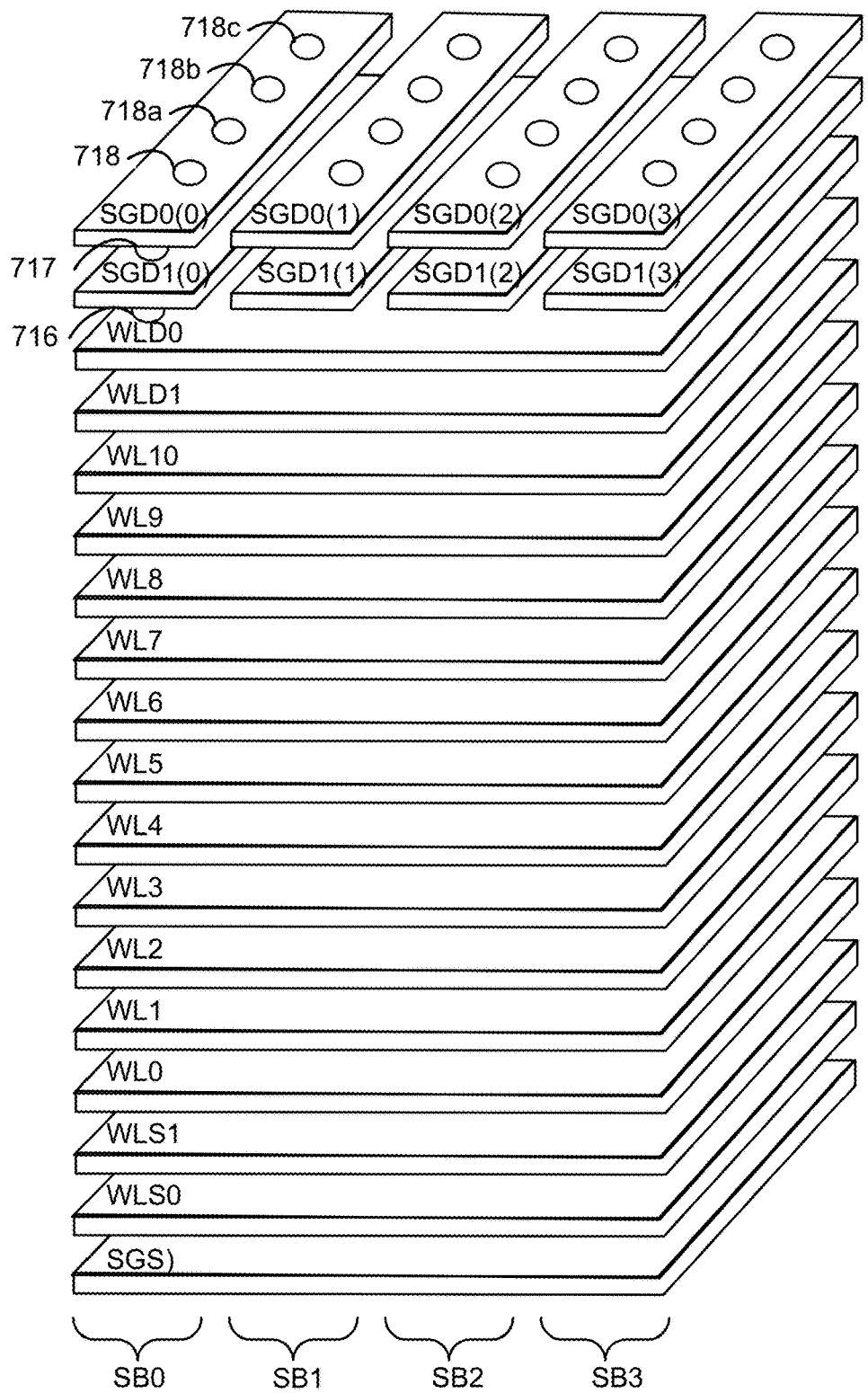
FIG. 8A depicts control gate layers in a stack consistent with FIG. 7.

FIG. 8A depicts control gate layers in a stack consistent with FIG. 7. The control gate layers include dummy word lines layers WLS0, WLS1, WLD0 and WLD1, and data word line layers WL0-WL10, which are shared among the different sub-blocks SB0-SB3. The control gate layers include the common SGS control gate layer for a block and separate SGD control gate layers for each sub-block. For example, SB0 includes SGD0(0) and SGD1(0), SB1 includes SGD0(1) and SGD1(1), SB2 includes SGD0(2) and SGD1(2), and SB3 includes SGD0(3) and SGD1(3). Additionally, four example memory holes are depicted in each sub-block. SGD transistors 718, 718a, 718b and 718c are depicted in SGD0(0), SGD transistor 717 is depicted in SGD1(0) and dummy memory cell 716 is depicted in WLD0.

Figure 8B:
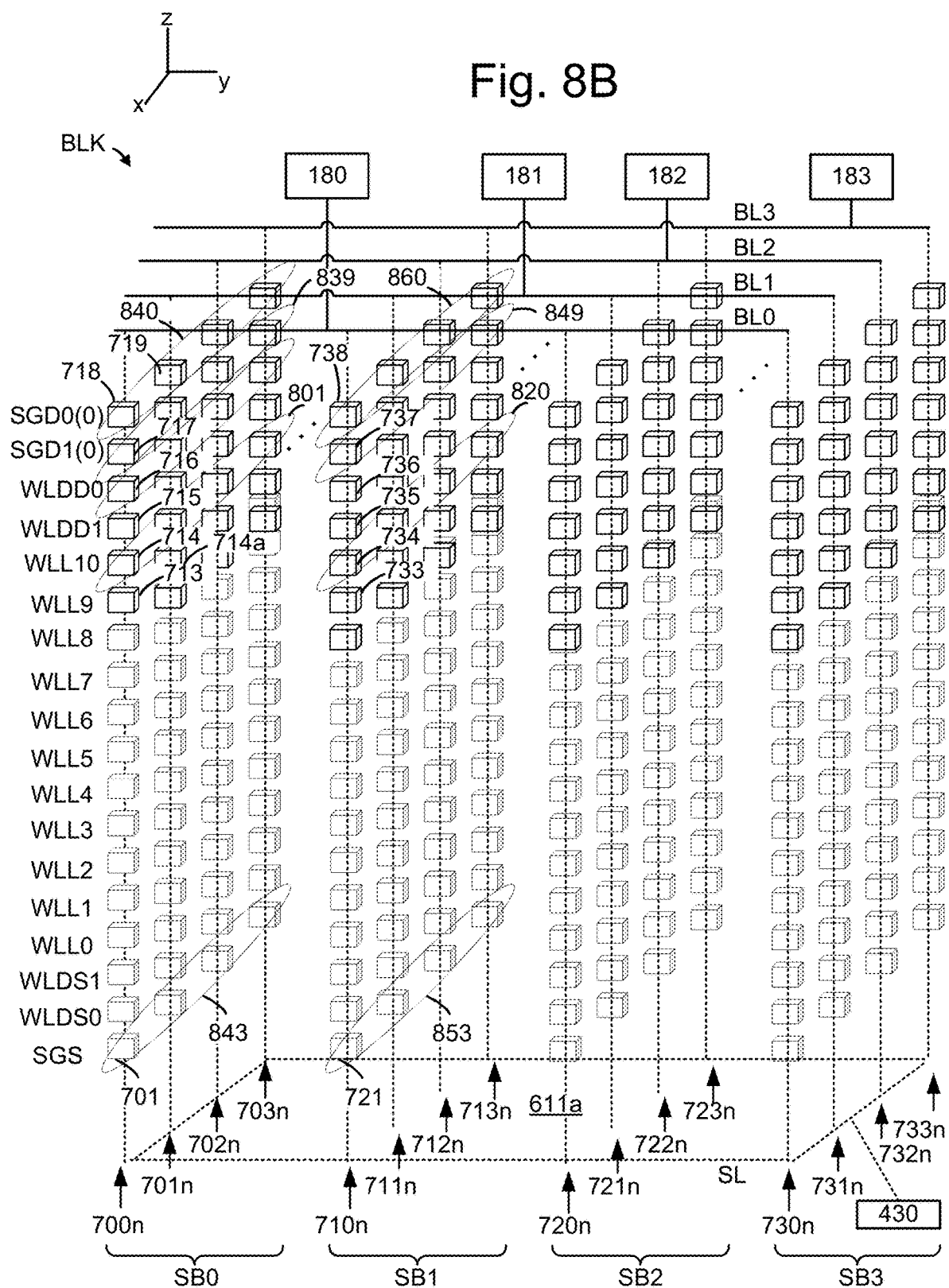
FIG. 8B depicts additional detail of the sub-blocks SB0-SB3 of FIG. 7.

FIG. 8B depicts additional detail of the sub-blocks SB0-SB3 of FIG. 7. Example memory cells are depicted which extend in the x direction along word lines in each sub-block. Each memory cell is depicted as a cube for simplicity. SB0 includes NAND strings 700n, 701n, 702n and 703n. SB1 includes NAND strings 710n, 711n, 712n and 713n. SB2 includes NAND strings 720n, 721n, 722n and 723n. SB3 includes NAND strings 730n, 731n, 732n and 733n. Bit lines are connected to sets of NAND strings. For example, a bit line BL0 is connected to NAND strings 700n, 710n, 720n and 730n, a bit line BL1 is connected to NAND strings 701n, 711n, 721n and 731n, a bit line BL2 is connected to NAND strings 702n, 712n, 722n and 732n, and a bit line BL3 is connected to NAND strings 703n, 713n, 723n and 733n. Sense circuits may be connected to each bit line. For example, sense circuits 180, 181, 182 and 183 of FIG. 2 are connected to bit lines BL0, BL1, BL2 and BL3.

Programming and reading can occur for selected cells in one word line and one sub-block at a time. This allows each selected cell to be controlled by a respective bit line and/or by the source line. For example, a set of memory cells 801, which includes an example memory cell 847, is connected to WL10 in SB0. This is the drain-end data word line. WL0 is the source-end data word line. A set of memory cells may be programmed or read concurrently. An additional set of memory cells is connected to WL10 in each of the other sub-blocks SB1-SB3. For example, a set of memory cells 820, which includes an example memory cell 857, is connected to WL10 in SB1.

In this example, the source line SL or source region is driven at a voltage Vsl by the source line voltage source 430.

Each NAND string includes one or more SGD transistors at the drain-end and one or more SGS transistors at the source end. In this case, there are two SGD transistors and one SGS transistor per string. Each SGD transistor may be connected to separate control line layer, as in FIG. 8A, so that it can be driven separately, or the two or more SGD transistors in a string may have their control gates connected and commonly driven. For example, SB0 has sets of SGD transistors 840 and 839, with example SGD transistors 718 and 717, respectively, in the NAND string 700n. The set of SGD transistors 840 also includes an example SGD transistor 719 in the NAND string 701n. SB0 also has a set of SGS transistors 843, with an example SGS transistor 701 in the NAND string 700n. Similarly, SB1 has sets of SGD transistors 860 and 849, with example SGD transistors 738 and 737, respectively, in the NAND string 710n. SB1 also has a set of SGS transistors 853, with an example SGS transistor 721 in the NAND string 710n.

The NAND string 700n includes SGD transistors 718 and 717 connected to select gate control lines SGD0(0) and SGD1(0), respectively, dummy memory cells 716 and 715 connected to WLD0 and WLD1, respectively, and data memory cells 714 and 713 connected to WL10 and WL9, respectively. The NAND string 710n includes SGD transistors 738 and 737 connected to select gate control lines SGD0(1) and SGD1(1), respectively, dummy memory cells 736 and 735 connected to WLD0 and WLD1, respectively, and data memory cells 734 and 733 connected to WL10 and WL9, respectively.

FIG. 9 depicts a voltage signal used in a series of program loops in an example program operation. The horizontal axis denotes a program loop number, ranging from 1-22, and the vertical axis denotes voltage. During a program operation, program loops are performed for a selected word line in a selected block in each plane. A program loop comprises a program portion in which a program voltage or pulse is applied to the selected word line followed by a verify portion in which a verify signal is applied to the selected word line while one or more verify tests are performed for the associated memory cells. Other than the erased state, each assigned state has a verify voltage which is used in the verify test for the state in a program operation.

The voltage signal 900 includes a series of program voltages, including an initial program voltage 901, which are applied to a word line selected for programming. In this example, the voltage signal includes program voltages which increase stepwise in amplitude in one or more program loops of a programming pass using a fixed or varying step size. This is referred to as incremental step pulse programming, where the program voltage starts at an initial level Vpgm_int (see program voltage 901) and increases in a step in each successive program loop, for instance, until the program operation is completed. A successful completion occurs when the threshold voltages of the selected memory cells reach the verify voltages of the assigned data states.

A program operation can include a single programming pass or multiple programming passes, where each pass uses incremental step pulse programming, for instance.

The verify signal in each program loop, including example verify signal 902, can include one or more verify voltages, based on the assigned data states which are being verified for the program loop. The verify tests can encompass lower assigned data states and then midrange assigned data states and then higher assigned data states as the program operations proceeds. The example verify signals depict three verify voltages as a simplification. More detailed examples of the verify signals are provided in FIGS. 12A and 14A.

All memory cells may initially be in the erased state at the beginning of the program operation, for instance. After the program operation is completed, a Vth distribution similar to that in FIG. 10 ideally is achieved, and the data can be read from the memory cells using read voltages which are between the Vth distributions. At the same time, a read pass voltage, Vpass (e.g., 8-10 V), also referred to as pass voltage, is applied to the remaining word lines. By testing whether the Vth of a given memory cell is above or below one or more of the read reference voltages, the system can determine the data state which is represented by a memory cell. These voltages are demarcation voltages because they demarcate between Vth ranges of different data states.

Moreover, the data which is programmed or read can be arranged in pages. For example, with four data states, or two bits per cell, two pages of data can be stored. An example encoding of bits for the Er, A, B and C states is 11, 10, 00 and 01, respectively, in the format of upper page (UP) bit/lower page (LP) bit. A lower page read may use VrA and VrC and an upper page read may use VrB.

With eight data states, or three bits per cell, three pages of data can be stored. See also FIG. 10. An example encoding of bits for the A, B, C, D, E, F and G states is 111, 110, 100, 000, 010, 011, 001 and 101, respectively. The data of the lower page can be determined by reading the memory cells using read voltages of VrA and VrE. The data of the middle page can be determined by reading the memory cells using read voltages of VrB, VrD and VrF. The data of the upper page can be determined by reading the memory cells using read voltages of VrC and VrG.

Figure 10:
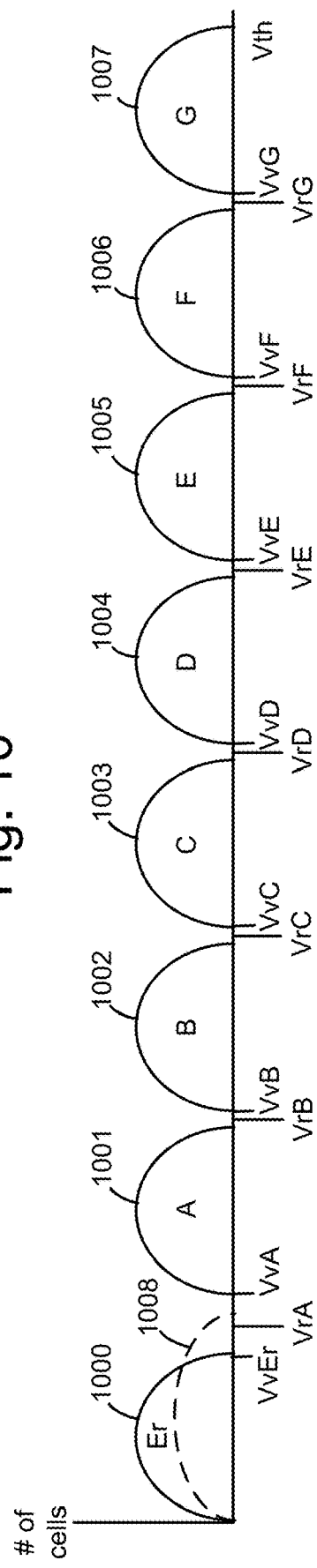
FIG. 10 depicts an example Vth distribution of sets of memory cells after a program operation.

FIG. 10 depicts an example Vth distribution of sets of memory cells after a program operation. The vertical axis depicts a number of memory cells, on a logarithmic scale, and the horizontal axis depicts a Vth of the memory cells on a linear scale. Eight data states are used, as an example. In one approach, at a start of the program operation, the memory cells are all initially in the erased state as represented by the Vth distribution 1000. After the program operation is successfully completed, the memory cells assigned to the Er state are represented by the Vth distribution 1008. The Vth distribution is upshifted due to some amount of program disturb which normally occurs.

The memory cells which are to be programmed to the A, B, C, D, E, F and G states using verify voltages of VvA, VvB, VvC, VvD, VvE, VvF and VvG, respectively, are represented by the Vth distributions 1001, 1002, 1003, 1004, 1005, 1006 and 1007, respectively. Read voltages VrA, VrB, VrC, VrD, VrE, VrF and VrG can be used for reading the states of the memory cells in a read operation. These verify voltages and read voltages are examples of control gate read levels of the selected word line voltage.

The Vth distribution 1008 of the erase state shows the effects of hot electron injection (HEI) type of read disturb. HEI disturb involves inadvertent programming of unselected memory cells adjacent to a selected word line due to voltage gradients in the channels of the NAND strings of the unselected memory cells. The disturb results in a Vth upshift for a memory cell and is strongest for erased state memory cells. The disturb is proportional to the magnitude and duration of the voltage gradient. See also FIG. 11A to 11E.

FIG. 11A depicts a plot of the NAND string 700n of FIG. 7, showing the movement of electrons during a read operation which cause a disturb. The NAND string includes the select gate transistors, data and dummy memory cells and channel 660 discussed in connection with FIGS. 6C and 7. The NAND string further includes the blocking oxide layer 663, charge-trapping layer 664 and tunneling layer 665 of FIG. 6C. WL4 is the selected word line (WLn) as an example. A set 1110 of source-side word lines is on the source side of WLn and a set 1111 of drain-side word lines is on a drain side of WLn. A region 1100 of the channel extends adjacent to SGS, a region 1101 of the channel extends adjacent to WLS0-WL3, a region 1102 of the channel extends adjacent to WL5-SGD0(0), and a region 1103 of the channel extends adjacent to SGD1(0) and SGD0(0).

FIG. 11B depicts a table showing control gate voltages of the memory cells and select gate transistors in FIG. 11A, (1a) before a read operation when the control gate voltages are floating and there is a first read situation, (1b) before a read operation when the control gate voltages are floating and there is a second read situation, (2) at a start of the read operation when the control gate voltages are at 0 V and (3) after the control gate voltages are increased to a level used for sensing. The table also lists the voltages Vsl and Vbl.

Row (1a) indicates that, in the first read situation, before a read command is issued, the word voltages will be floated at a relatively low level, such as 0 V. This time may be an idle time of the memory device. The SGS control gate voltage can also be floated. This provides a simpler circuit implementation compared to the option of driving the SGS control gate voltage at 0 V. Generally, the SGS transistor will be non-conductive when it is floating during this idle time. However, the SGD control gate voltage may be driven at 0 V to avoid any possible leakage current through the unselected blocks.

Row (1b) indicates that, in the second read situation, before a read command is issued, the word voltages will be floated at a relatively high level, such as 4 V. In either situation, the SGD voltages may be driven at 0 V, and the SGS voltage may be floated, in one approach. When SGD1 (0) is driven at 0 V, a channel region 1106 which is between WLD0 and SGD1(0) can be cutoff, assuming the transistor 717 has a Vth>0 V.

Row (2) indicates that when a read command is initially issued, the word line voltages and SGS voltage will be driven at 0 V rather than being floated. Row (3) indicates that the unselected word line voltages and the select gate transistor voltages will subsequently be driven higher, from 0 V to a pass voltage level of Vsg_pass, e.g., 6-8 V, for the select gate transistors, or Vpass, e.g., 8-10 V, for the memory cells. The selected word line voltage will be driven from 0 V to Vcgr, the read level. Vcgr and the pass voltages can be maintained during the sensing of the conductive state of the selected memory cells.

In FIG. 11C to 11E, the column headings of 1100, 1101, 1102 and 1103 represent the channel regions in FIG. 11A. As explained in connection with FIG. 12A to 12D, the voltages of the channel regions typically return to a level close to 0 V after a sensing operation, while the word line voltages can float at a positive level, Vwl_coupled_up, before decaying back to about 0 V. The second read situation exists when the word line voltages are at Vwl_coupled_up and the first read situation exists when the word line voltages are at 0 V.

FIG. 11C depicts a table showing voltages in the channel 660 of FIG. 11A for the case of a first read situation without an SGD control gate voltage pulse, consistent with FIG. 11B, rows 1a, 2 and 3. Row (1) corresponds to the case of the control gate voltages of row (1a) of FIG. 11B. The channel regions 1100, 1101 and 1102 are at 0 V, and the channel region 1103 is at 1 V.

Referring to row (2), which corresponds to the case of the control gate voltages of row (2) of FIG. 11B, the channel regions 1100, 1101, 1102 and 1103 are at 0 V, −4 V, 0 V and 1 V, respectively. When the word line voltages are driven at 0 V at the start of a read operation, the channel region 1105 which is between WLn−1 (WL3) and WLn (WL4) can be cutoff, assuming the memory cell 708 is programmed to a data state with a Vth>0 V. Similarly, when SGS is driven at 0 V, a channel region 1104 which is between SGS and WLS0 can be cutoff, assuming the transistor 701 has a Vth>0 V. The channel region 1104 may remain in a cutoff state which existed when SGS control gate voltage was floating before the read command was issued. The channel region 1101 can also be down coupled to −4 V, for example. Specifically, if the memory cell 708 has Vth=4 V, for example, the application of 0 V on the word line WL4 results in a voltage of about −4 V (the control gate voltage minus the Vth) at the source side of the memory cell 708 and in the channel region 1101. We can assume the other data memory cells are in any random data state.

Due to the cutoff at the channel regions 1104 and 1105, the voltage in the channel region 1101 floats. Similarly, due to the cutoff at the channel regions 1105 and 1106, the voltage in the channel region 1102 floats.

Referring to row (3), which corresponds to the case of the control gate voltages of row (3) of FIG. 11B, the channel regions 1100, 1101, 1102 and 1103 are at 0 V, 0 V, 8 V and 1 V, respectively. When the word line voltages are ramped up from 0 V to Vpass, this capacitively couples up the channel region 1102 to 8 V (0 V+8 V). Moreover, the channel region 1104 is no longer cutoff due to an increase in the control gate voltage for SGS from 0 V to Vsg_pass. As a result, the channel region 1101 is driven by Vsl=0 V and not floated.

The channel region 1101 is therefore not coupled up in the same way as the channel region 1102. The channel region 1103 continues to be driven at Vbl=1 V, for example. With 8 V in the channel region 1102 on the drain side of WLn and 0 V in the channel region 1101 on the source side of WLn, there is a channel gradient of 8−0=8 V in the channel adjacent to WLn. The channel gradient generates electron-hole pairs, where the electrons (such as example electron 1107) can be drawn into the charge trapping layer 664 adjacent to WLn+1 (WL5). This causes a disturb of the memory cell 709 such as depicted in FIG. 10 (Vth distribution 1008).

FIG. 11D depicts a table showing voltages in the channel 660 of FIG. 11A for the case of a second read situation without an SGD control gate voltage pulse, consistent with FIG. 11B, rows 1b, 2 and 3. Row (1) has the same values as row (1) in FIG. 11C for the reasons mentioned previously. The channel regions 1100, 1101 and 1102 are at 0 V, and the channel region 1103 is at 1 V.

Row (2) has the same values as row (2) in FIG. 11C for the reasons mentioned previously, except the channel region 1102 is down coupled to −4 V due to the transition of the word line voltages from the floating level of 4 V to the driven level of 0 V. In contrast, in the first read situation, there is little or no change in the voltage of the channel region 1102 when the word line voltages transition from floating to being driven at 0 V.

Row (3) has the same values as row (2) in FIG. 11C for the reasons mentioned previously, except the channel region 1102 is coupled up to 4 V (−4 V+8 V) due to the capacitive coupling from the voltage swing of the unselected word lines.

With 4 V in the channel region 1102 on the drain side of WLn and 0 V in the channel region 1101 on the source side of WLn, there is a channel gradient of 4−0=4 V in the channel adjacent to WLn. The channel gradient and the corresponding disturb of the memory cell 709 is therefore significantly reduced compared to the first read situation of FIG. 11C.

In FIG. 11C to 11E, in row (3), the voltages which determine the channel gradient are bolded and underlined.

FIG. 11E depicts a table showing voltages in the channel 660 of FIG. 11A for the case of a first read situation with an SGD control gate voltage pulse, consistent with FIG. 11B, rows 1a, 2 and 3.

Row (1) has the same values as row (1) in FIG. 11C for the reasons mentioned previously. The channel regions 1100, 1101 and 1102 are at 0 V, and the channel region 1103 is at 1 V.

Row (2) has the same values as row (2) in FIG. 11C for the reasons mentioned previously.

Row (3) has the same values as row (2) in FIG. 11D. This is achieved by reducing the amount of coupling up of the channel region 1102 during the increase of the voltages of the unselected word lines, by temporarily providing the SGD transistor or transistors in a conductive state. With 4 V in the channel region 1102 on the drain side of WLn and 0 V in the channel region 1101 on the source side of WLn, there is a channel gradient of 4−0=4 V in the channel region adjacent to WLn. The channel gradient and the corresponding disturb of the memory cell 709 is therefore significantly reduced compared to the first read situation of FIG. 11C, which does not use the SGD control gate voltage pulse.

The coupling up of the channel region 1102 during the increase of the unselected word line voltages relies on the fact that the channel region is floating. By temporarily providing the SGD transistor or transistors of an unselected NAND string in a conductive state using an SGD control gate voltage pulse, the channel region 1102 is temporarily prevented from floating and is instead connected to the bit line. In this example, a reduced amount of coupling up occurs which can avoid the HEI type of read disturb. Some channel boosting can remain as this may be desirable for reducing normal read disturb, which is caused by weak Fowler-Nordheim (F-N) tunneling due to a large voltage difference between the control gate and a channel of a memory cell.

Moreover, the magnitude and/or duration of the SGD control gate voltage pulse can be optimized based on the time since the last sensing operation and/or the temperature, to provide an optimum amount of channel boosting which combats both HEI disturb and normal read disturb.

In some cases, a larger duration or magnitude for the SGD control gate voltage pulse can increase the overall time for the read operation, due to the time used to set up and recover from the voltage pulse. In these cases, providing the larger duration or magnitude for the SGD control gate voltage pulse when there is an indication of a likelihood of HEI disturb, but not at other times, can avoid unnecessary increases in the overall time of the read operation.

FIG. 12A depicts a plot of example waveforms in a program operation, showing coupling up of a word line voltage. The coupling up can occur for data and dummy word lines after a sensing operation which occurs, e.g., as part of a program or read operation. The coupling up can be up to about 4 V, for instance. The coupling up occurs while the word line voltages are floating. FIGS. 12A and 12B describe the coupling up which occurs after the verify portion of a program operation and FIGS. 12C and 12D describe the coupling up which occurs after a read operation.

The time period shown represents one program-verify iteration or loop. The horizontal axis depicts time and the vertical axis depicts word line voltage, Vwl. A program voltage 1200 is applied to a selected word line from t0-t4 and reaches a magnitude of Vpgm. The program voltage can temporarily pause at an intermediate level such as Vpass to avoid a single large transition which can have undesired coupling effects. A pass voltage 1205 is applied to the unselected word lines from t0-t19 and reaches a magnitude of Vpass, which is sufficiently high to provide the memory cells in a conductive state so that the sensing (e.g., verify) operations can occur for the memory cells of the selected word line. The pass voltage includes an increasing portion, a fixed amplitude portion, for instance, at Vpass and a decreasing portion. Optionally, the pass voltage may be increased sooner relative to the program voltage so that Vpass is reached by t0.

A verify voltage 1210 is applied to the selected word line. In this example, all seven verify voltages are applied, one after another. An eight-level memory device is used in this example. Verify voltages of VvA, VvB, VvC, VvD, VvE, VvF and VvG are applied at t8, t9, t10, t11, t12, t13 and t14, respectively. The sense circuits may be activated during each verify voltage. The waveform decreases from VvG to 0 V or other steady state level from t15-t16.

For the unselected word lines, including the dummy word lines, the decrease in Vpass will cause the memory cells to transition from a conductive state to a non-conductive state. In particular, when the Vpass falls below a cutoff level, Vcutoff (the dotted line at t18), the channel of the memory cell will become cutoff, e.g., the memory cell will become non-conductive. When a cell becomes non-conductive, it acts as a capacitor in which the control gate is one plate and the channel is another plate. A cell becomes non-conductive when Vcg<Vcutoff or Vcg<(Vth+Vsl), where Vcg is the control gate voltage of the memory cell (the word line voltage), Vth is the threshold voltage of the memory cell and Vsl is the source line voltage which in turn is approximately the voltage at the source terminal of the memory cell. For a cell in the highest programmed state, e.g., the G state, the Vth can be as low as VvG and as high as the Vth at the upper tail of the G state in the Vth distribution 1007 in FIG. 10. Vcutoff can therefore be as low as VvG+Vsl or as high as Vth of the G state upper tail+Vsl. As the pass voltage 1205 decreases from Vcutoff to 0 V, the channel is capacitively coupled down by a similar amount, as represented by plot 1215 in FIG. 12B.

The voltage swing while the channel is cutoff will be larger when Vsl is larger. However, since Vch=Vsl, the minimum downcoupled level of Vch will be essentially independent of Vsl. For example, a 6 V swing in the word line voltage (e.g., Vcutoff=6 V) with Vsl=1 V will result in about the same minimum downcoupled level of Vch as a 5 V swing in the word line voltage (e.g., Vcutoff=5 V) with Vsl=0 V.

The plot 1212 represents one example of the coupling up of the word line voltages from t19-t20. The coupling up is depicted as occurring relatively quickly but this is not to scale. In practice, the verify operation, e.g., from t5-t19, may consume about 100 microseconds, while the coupling up of the word line may be significantly longer, in the millisecond range such as 10 milliseconds. This example assumes the word line voltage has reached its intended minimum ramped down level of Vss=0 V, for instance. When Vwl is subsequently coupled up, it reaches a maximum level of Vwl_coupled_up and the block is in the second read situation. Vwl gradually discharges back to 0 V over a period of several minutes to return the block to the first read situation.

FIG. 12B depicts a plot of a channel voltage (Vch) corresponding to FIG. 12A. Vch for an unselected NAND string (a string not having a cell which is programmed in the current program loop), will be boosted to a level such as 8 V (not shown) during the program voltage, e.g., from t0-t4. This boosting is achieved by providing the SGD and SGS transistors of the unselected string in a non-conductive state to cause Vch to float. Vch is coupled higher due to capacitive coupling when Vpass and Vpgm are applied to the word lines. For a selected NAND string (a string having a cell which is programmed in the current program loop), Vch is typically grounded as shown during the program voltage.

During the verify voltages, Vch may be initially at about 1 V, for instance, for a selected NAND string. Vch is about the same as Vsl for the channels of the selected NAND strings. Vsl is set based on a type of sensing which is used. Examples include negative sensing in which Vsl is about 1 V and positive sensing in which Vsl is about 0 V and a negative word line voltage is used. The techniques described herein apply regardless of the level of Vsl or the type of sensing used.

The channel is capacitively coupled down to a minimum level from t18-t19 and then begins to return to a final level of, e.g., 0 V from t19-t20. If the voltages of the word lines are allowed to float starting at t19, the voltages (plot 1212) are capacitively coupled higher by the increase in Vch. In one example, the voltages of the word lines float to a peak level of Vwl_coupled_up (plot 1212), e.g., about 4 V. For example, Vcutoff may be 6 V, so that there is a 6 V change in the word line voltage, e.g., 6-0 V, which is coupled to the channel. With the initial value of Vch at 1 V and a 90% coupling ratio, the minimum Vch may be about 1-6×0.9=−4.4 V, for instance. Accordingly, as Vch returns to 0 V, there is a 4.4 V increase in Vch which is coupled to the word line, e.g., control gate, of the memory cells. By applying the 90% coupling ratio to this coupling up, Vwl_coupled_up may be about 4.4×0.9=4 V. The voltages of the word lines are floated by disconnecting the word lines from a word line driver.

The channel voltage of plot 1215 correspond to the word line voltages of plots 1212 after t19.

FIG. 12C depicts a plot of example waveforms in a read operation, showing coupling up of a word line voltage. A read operation is similar to a verify operation as both are sensing operations and both can provide a coupling up of the word line voltages. The horizontal axis depicts time and the vertical axis depicts word line voltage, Vwl. Pass voltages of plots 1230, 1231 and 1232 are applied to the unselected word lines from t0-t3, t4-t8 and t9-t12, respectively, and have a magnitude of Vpass. The pass voltage includes an increasing portion, a portion at Vpass and a decreasing portion. A read voltage includes separate waveforms 1220 (at levels of VrA and VrE), 1221 (at levels of VrB, VrD and VrF) and 1222 (at levels of VrC and VrG) for each of the lower, middle and upper pages, respectively, consistent with FIG. 10. The read voltages are applied to the selected word line. An eight-level memory device is used in this example.

For the unselected word lines, the decrease in Vpass will cause the memory cells to transition from a conductive state to a non-conductive state, as discussed. The dotted line at t13 indicates when a G state cell becomes non-conductive. As the pass voltage 1232 decreases from Vcutoff to 0 V, the channel is capacitively coupled down by a similar amount, as represented by the plot 1235 in FIG. 12D. As the channel voltage increases after t14, the word line voltages are floated and are coupled higher, to Vwl_coupled_up.

FIG. 12D depicts a plot of a channel voltage (Vch) corresponding to FIG. 12C. The channel is capacitively coupled down to a minimum level of Vch_min from t13-t14 and then begins to return to a final level of, e.g., 0 V from t14-t15. If the voltages of the word lines are allowed to float starting at t14, the voltages (plot 1232) are capacitively coupled higher by the increase in Vch (plot 1235). The voltages of the word lines float to a peak level of Vwl_coupled_up, as discussed in connection with FIG. 12B.

Post-Read Disturbs

In addition to disturb that may occur during a read operation, some post-read disturb may occur after a read operation, as a result of conditions remaining after the read operation. For example, one or more component, such as a word line or channel, may retain some charge after a read operation and may subsequently discharge (see, for example, FIGS. 12C and 12D above showing post-read changes in word line and channel voltages). This may cause some disturbs during the time that the word line takes to discharge, e.g. disturbing cells in the erased state, potentially causing them to be misread as programmed. This problem may be worse under certain conditions and in certain types of memory. For example, the problem may be worse in memory blocks that have experienced a lot of wear (e.g. a large number of write-erase cycles). It may be worse at higher temperatures than at lower temperatures or may be worsened by other conditions. In general, simply providing longer times for discharging is not desirable because this may impact performance. Examples of the present technology reduce post-read disturbs using a variety of different approaches. Different approaches may be applied individually or in combination and may be applied selectively (e.g. only after a predetermined number of write-erase cycles, only on certain types of blocks, only above a predetermined temperature, or only when some condition or other triggering event occurs).

Aspects of the present technology reduce the voltage that may remain on word lines after a read operation occurs without returning to first read conditions, which may cause other problems (e.g. may cause memory cells to be misread because of other effects). For example, a word line may be discharged to zero volts, or near zero volts, after a read operation. Subsequently, a Control Gate (CG) line (global word line) that is selectively coupled to the word line through a block select transistor (also referred to as a pass transistor, e.g. pass transistors 422 illustrated in FIG. 4 above) may be maintained at a low positive voltage e.g. a voltage that is relatively low compared with a read voltage but is greater than zero. For example, where a read voltage is about 8 volts (e.g. in a range of 7.0 to 9.0 volts), a CG line may be brought to a low positive voltage of about 1.8 volts, or 2.5 volts (e.g. in a range of 1.0 to 2.0 volts, or 1.5 to 3.0 volts) after an initial discharge to substantially zero volts (e.g. in a range of −0.5 to 0.5 volts, or −1.0 to 1.0 volts in certain cases) to discharge the word line (local word line) to substantially zero volts. (The term "local word line" may be used instead of "word line" to refer to a word line of a block and to clearly distinguish from global word lines which are shared by blocks and separated from local word lines by block select transistors.) Maintaining such a low positive voltage on the CG line after the block select transistor turns off may keep the local word line voltage from being excessively high, while avoiding first read effects that might occur if the CG line was maintained at 0 volts.

Where two or more blocks share a block select line, any blocks sharing a block select line with a selected block being read may also suffer some post-read disturb (i.e. blocks that are not read that share a block select line may also suffer post-read disturbs, e.g. because of voltage on their word lines). A low voltage may also be applied to global word lines of any such blocks after a read of the selected block.

In some cases, a voltage to a block select transistor may be maintained at a high level for a longer period of time to provide more time for word line discharge (i.e. keeping the block select transistor turned on for longer to give more time for local word line discharge). This may be done without increasing overall read time.

In some cases, a channel may remain connected to a bit line for a longer period of time so that more word line discharge occurs prior to the channel being isolated. In this way, the local word line voltage when the channel becomes isolated and starts to float is reduced. This means that the channel couples down to a less negative voltage and the local word line residual voltage and resulting disturbs are reduced accordingly.

Figure 13:
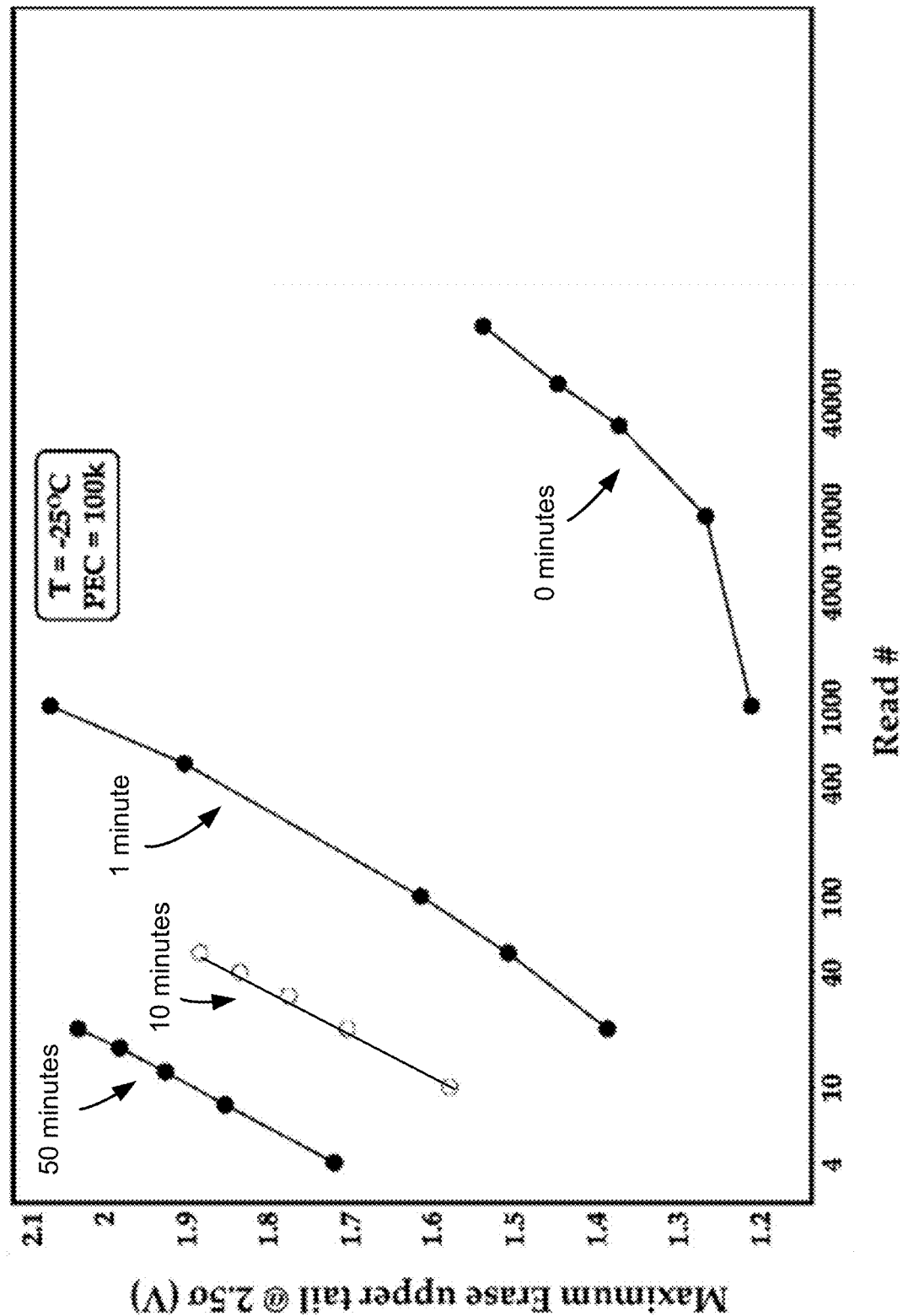
FIG. 13 illustrates post-read disturb after different delays and different numbers of reads.

It has been observed that in 3D memory such as BiCSs, inserting delay between reads results in significant disturb on erase state ('Er'), especially on heavily cycled Single Level Cell (SLC) blocks (blocks in which each cell uses two states to store one bit of data). This may limit read disturb (RD) capability of such memory. FIG. 13 shows the problem in terms of increase in 'Er' (erase state) Upper Trail (UT) for various delays inserted between reads for 100,000 SLC cycled blocks (i.e. blocks with a Program Erase Count, PEC=100 k) at a temperature of −25 degrees Centigrade (T=−25° C.). The UT value on the y-axis indicates the 2.5σ threshold voltage of 'Er' population of the cells for each mentioned set of conditions. The curves point to the extent of upwards shift in threshold voltage distribution of the erased state as a function of the number of reads and the delay between reads. It can be seen that the disturbance increases with increased number of reads for all delay times. It can also be seen that disturbance increases with increasing delay time, e.g. worse after 1 minute than after 0 minutes, worse again after 10 minutes, and even worse after 50 minutes.

This post-read disturb during delay between reads is believed to be caused by the residual potential on the word lines (WLs) after the read operation and is a function of its discharge during a period of time after the read operation. The origin of this residual WL potential can be explained using the timing diagrams in FIGS. 12C and 12D above and in more detail in the timing diagram of FIG. 14.

Figure 14:
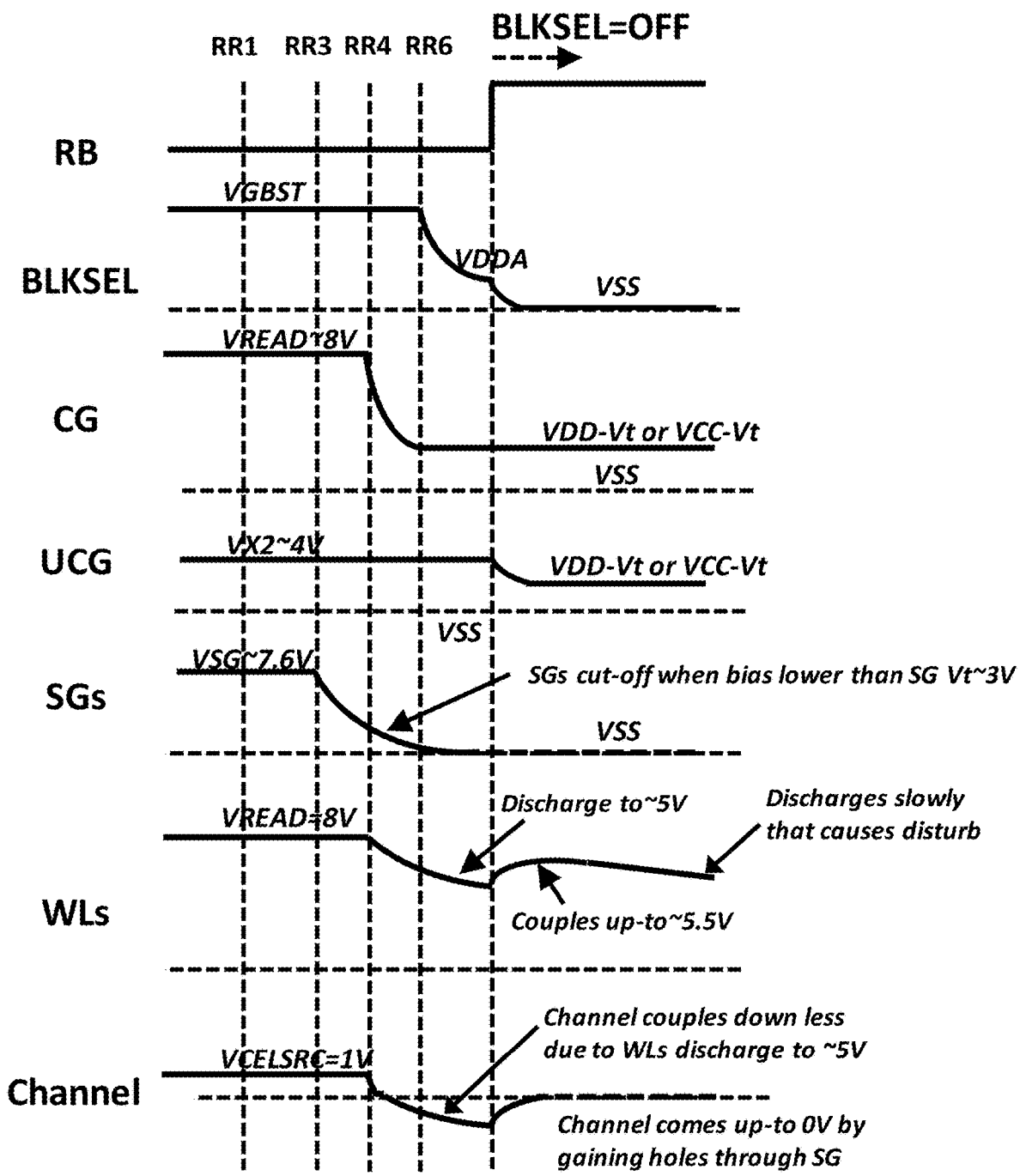
FIG. 14 is a timing diagram showing post-read coupling up of word line voltage.

FIG. 14 shows voltages of different components during and after a programming operation including a series of times RR1 to RR6, where the indicated times extend from RR1 at the end of a read operation to RR6 when a block select voltage BLKSEL starts to drop and subsequently BLKSEL turning off (isolating local word lines of the block from global word lines). "RB" indicates the block Ready/Busy signal voltage, which is low when the block is busy (e.g. during a read operation) and high otherwise (e.g. between read operations). BLKSEL is a voltage applied to block select transistors (pass transistors) coupling the word lines of the block to CG lines (also referred to as global word lines, which connect local word lines to word line drivers as illustrated in FIG. 4). "BLKSEL" is generally high when the block is selected (local word lines coupled to global word lines from word line drivers providing voltages for memory access) and low when the block is unselected (local word lines decoupled, e.g. or floating). In some cases, blocks may share a BLKSEL line so there may be one or more unselected block that has its block select transistors turned on and thus has its local word lines connected to global word lines (CG lines). "CG" in FIG. 14 refers to the voltage of CG lines, or global word lines, that connect word line driver circuits to local word lines through block select transistors. "UCG" refers to global word line voltage applied to an unselected block that shares a block select line with a block that is selected (what may be referred to as an "EOC block"). Thus, UCG voltages in FIG. 14 and subsequent figures are voltages provided by global word lines and coupled to local word lines of unselected blocks that share block select transistors with a selected block. "SGs" refers to voltage applied to Select Gates of the selected block (i.e. from select gate drivers). "WLs" refers to voltage on local word lines both during read (when word lines are coupled to CG lines through block select transistors, e.g. at time RR1) and after (when word lines are decoupled from CG lines by block select transistors to float, e.g. after BLKSEL=OFF). "Channel" refers to voltage of channels of NAND strings in a selected block (including after channel is decoupled from bit lines as a result of select gates or some cells turning off).

FIG. 14 shows that that, at the end of a read operation, all CGs (global word lines) are expected to discharge from VREAD (about 8 volts) to VDD (e.g. about 1.8 volts) or VCC (e.g. about 2.5 volts), minus the threshold voltage Vt of a block select transistor. This CG discharge begins at RR4 which is after select gates (SGs) start to discharge at RR3.

Select gates (which control connection of the channel) are cut-off when the bias on SG lines is lower than select gate transistor threshold voltage, e.g. at SG Vt=3 volts, which is shown occurring near the start of RR4 in FIG. 14. Thus, the channels float at a time when the WLs are still close to VREAD (i.e. before they have discharged to a low voltage, or to zero volts). The floating channels couple down as local word lines discharge further during RR4-RR6 (e.g. because of capacitive coupling between the floating channels and the discharging local word lines. The expectation is that local word lines discharge from VREAD to VDD at the end of RR6. However, since total discharge time (RR4+RR5+RR6) maybe insufficient for full discharge, VREAD may not discharge to VDD but to some higher voltage (e.g. to about 5 volts as shown in FIG. 14). As a result, channels may couple down less than would be expected.

When word lines are floating (when BLKSEL is low, turning off block select transistors), channel potential slowly recovers back by gaining holes through select gate transistors (i.e. some leakage occurs even when select gate transistors are turned off to generally isolate the channels) causing word lines to couple up to a positive creep-up voltage (e.g. couples up to about 5.5 volts as shown by WLs voltage in FIG. 14). This potential acts as a residual word line potential and it discharges over time, which can span several hours and may cause disturbance. This problem may become worse after cycling due to cycling induced MANOS stack degradation (degradation of memory hole and charge trapping layer). Thus, this is particularly a problem for heavily cycled blocks including both SLC and Three Level Cell (TLC) memories and also for Multi-Level Cell (MLC) memories that experience high cycle counts.

Figure 15:
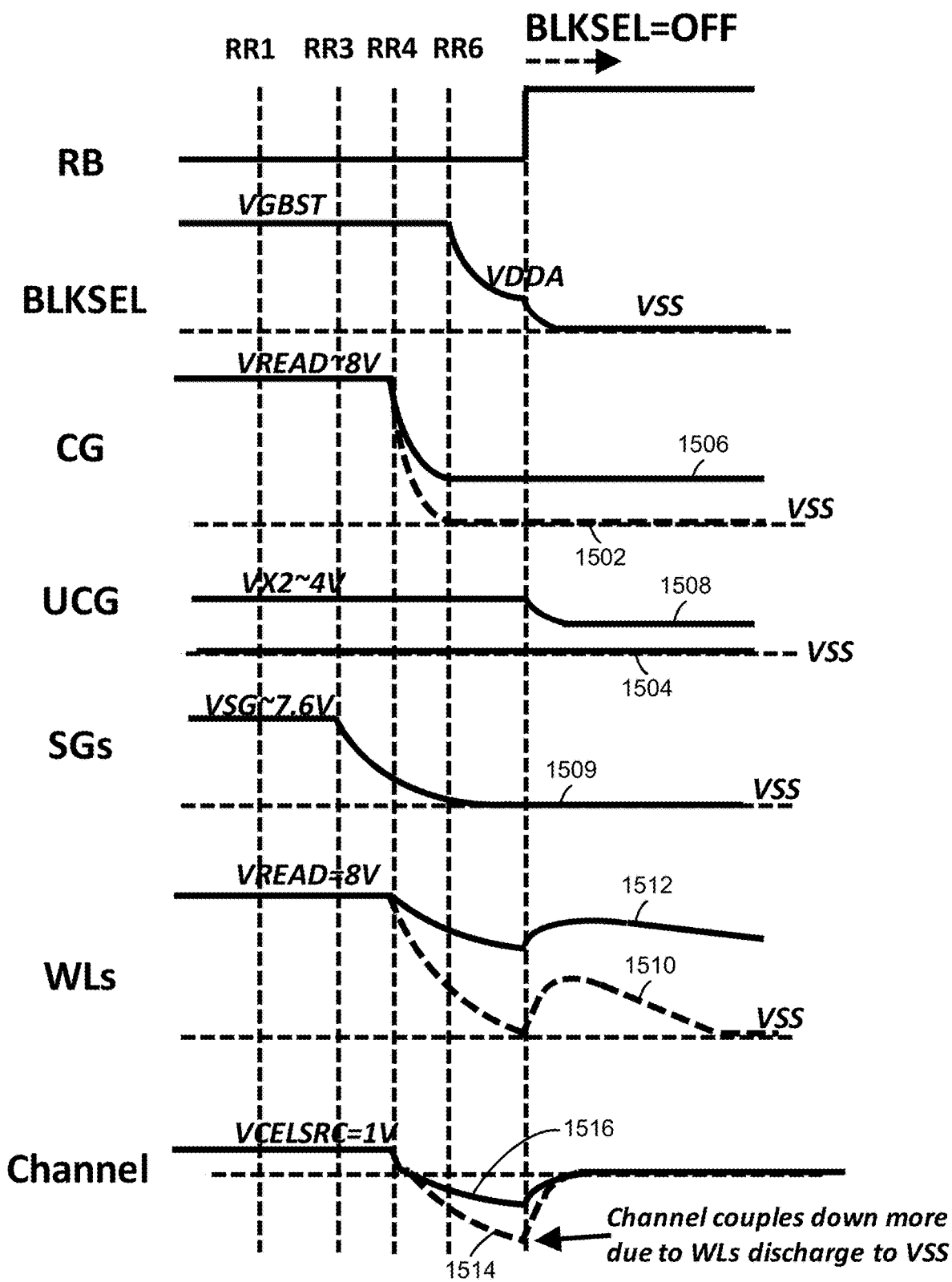
FIG. 15 is a timing diagram showing global word line voltage (CG) reduced to VSS after read.

One option is to discharge local word lines from VREAD to zero or near zero voltage (e.g. VSS) at the end of read operation [which may be indicated as NOCGDIS=0=disable]. This option also holds CG voltage on global word lines to VSS during a delay after read. FIG. 15 compares the biasing of this approach (dashed lines) with the biasing shown in FIG. 14 (solid lines). For global word line voltages (CG and UCG), this means the voltage goes to VSS (lower lines 1502, 1504 respectively) instead of VDD or VCC (upper lines 1506, 1508 respectively). Select gate voltage (SG) remains as before as shown by line 1509. The resulting voltage on local word lines is shown by dashed line 1510, where local word lines discharge to VSS (e.g. zero volts) by the time BLKSEL=OFF, lower than the discharge to about 5 volts of line 1512, as previously shown in FIG. 14. The deeper discharge of local word lines illustrated by line 1510 causes more coupling down of the channel as illustrated by line 1514 compared with line 1516 (showing result of FIG. 14). Subsequently, local word line voltages couple back up to about 4 volts, which is less than the 5.5 volts experienced without discharge of local word lines to VSS (e.g. line 1510 does not come back up to a voltage as high as line 1512).

This option (discharge of local word lines to substantially zero volts, e.g. VSS) can be effective to reduce disturb during post-read delay but discharging residual potential on the local word lines during delay to VSS also forces cells to be in a first read state which may give higher fail bit counts (FBCs) when they are read since read levels may be optimized for second read state. In general, a first read condition occurs when memory cells are first read after newly powered up, where voltages on local word lines are at or close to zero volts. Subsequently, the memory array may be maintained in a condition with certain components such as word lines charged up so that subsequent reads do not require charging up of components from zero. This causes some differences between a first read and a second read as previously described. In general, read parameters are tuned for second read conditions and returning to first read conditions may cause misreading and bad bits. Therefore, it is not generally desirable to return to first read conditions. While the option illustrated in FIG. 15 may reduce FBCs (Failure Bit Counts) due to post-read disturb during delay, it may cause higher FBC due to forcing cells into a first read condition thereby trading off one problem with another.

In examples presented below, methods are disclosed to reduce errors that may occur during delay between reads (e.g. due to local word line discharge) while still keeping cells at or closer to a second read state.

Method 1: In a first example shown in FIG. 16A, a hybrid approach is taken, in which global word lines for a selected block (CG) are discharged to VSS (e.g. zero volts or substantially zero volts) at RR4 and are kept at VSS from RR6 until BLKSEL=OFF. When BLKSEL=OFF, global word lines (CG) are brought to a low positive bias such as VDD (e.g. 1.8 volts) or VCC (e.g. 2.5 volts) as illustrated by line 1620. In this way a residual voltage during post-read delay may be low enough to reduce disturb during delay and still keep cells closer to a second read state. Residual voltage during delay will be reduced because of the following:

Discharging VREAD to VSS at RR4 may force channels to go negative as soon as channel floats due to either SG bias to select transistors cutting off the channel or one or more cells with the highest threshold voltage (Vt) along a given NAND string cuts off the channel of the string when local word line voltage (WLs) drops below Vt.

Keeping VSS on global word lines (CG voltage, shown by line 1620) may allow more time for the channel to gain holes through select transistors, thereby coupling down to lesser negative potential as shown by line 1622, which shows channel voltage.

When BLKSEL=OFF, local word lines are isolated from global word lines and local word lines float to a residual voltage decided by the potential on the local word line when the BLKSEL is turned off, in combination with the swing in channel potential. In other words, voltage to which the local word lines float is determined by the voltage on these word lines when the channel begins to float. Since this voltage is reduced by discharging local word lines to VSS at RR4 (as shown by line 1624), residual voltage will be reduced on the local word lines as illustrated by line 1624. This may reduce disturb during delay compared with transitioning global word lines directly from VREAD to a low voltage (e.g. line 1506), which results in higher residual voltage (as illustrated by line 1512).

Figure 16A:
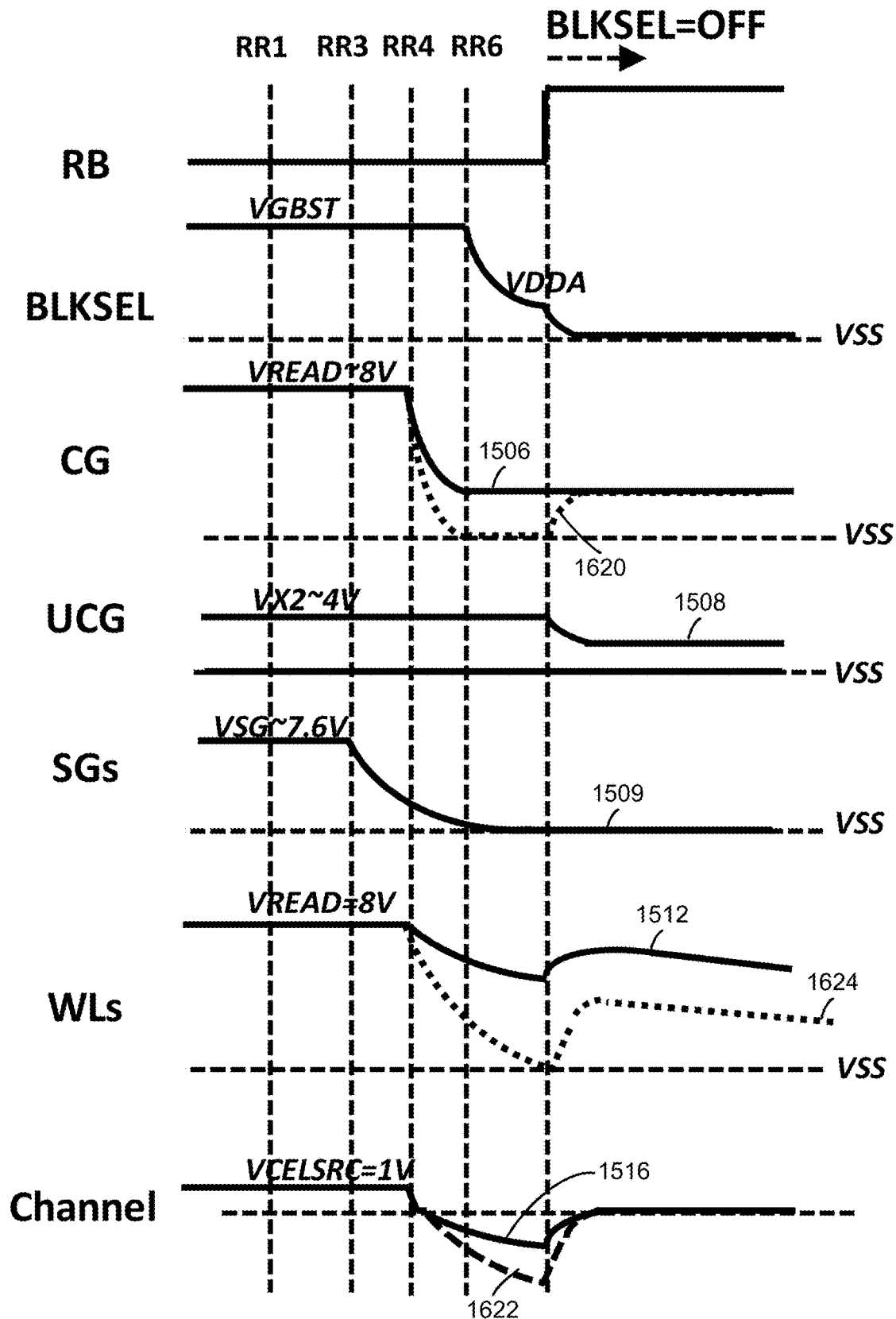
FIGS. 16A-B show global word line voltage (CG) reduced to VSS and subsequently increased to a low positive voltage (e.g. VDD or VCC).
Figure 16B:
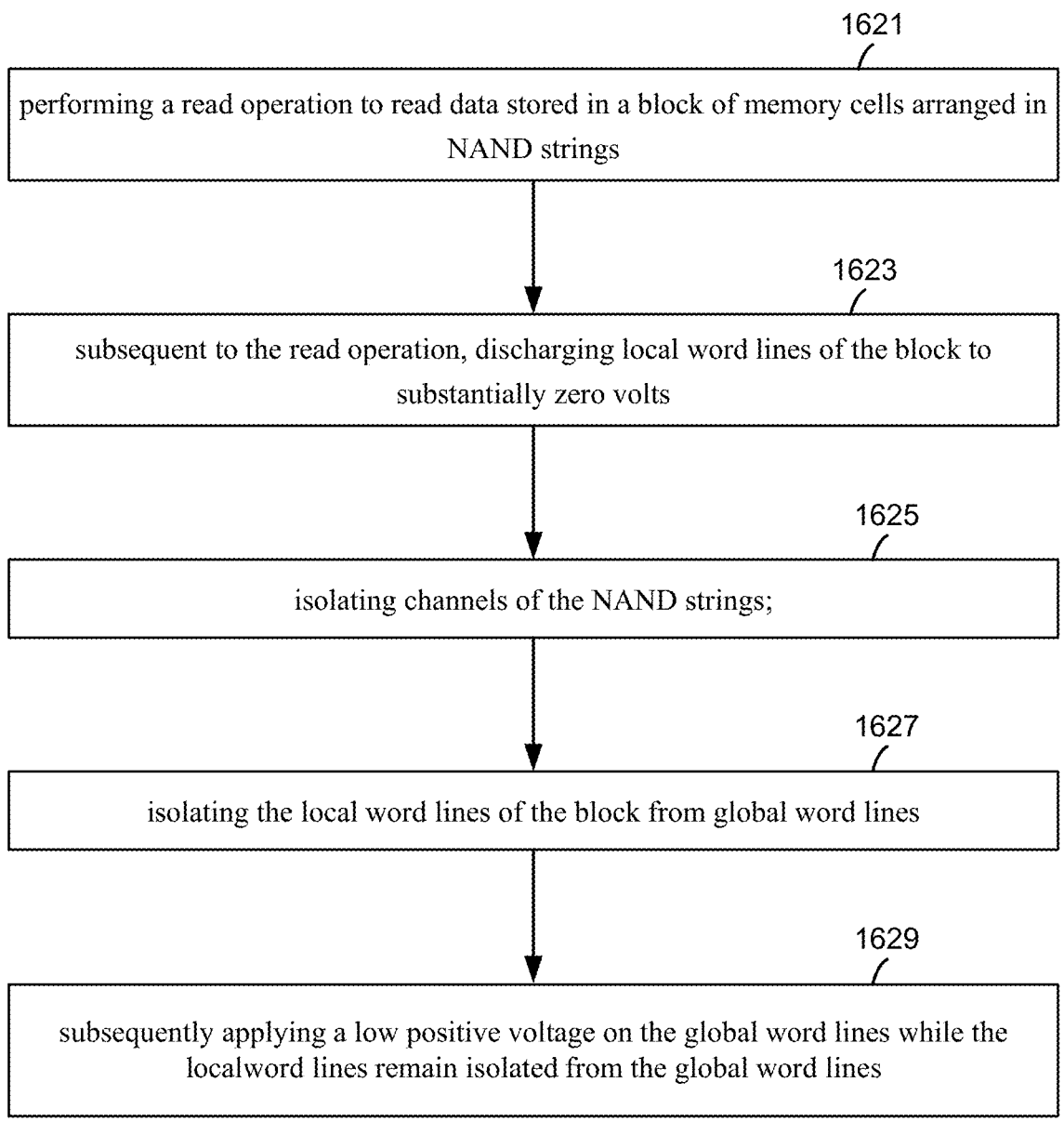

FIG. 16B shows an example of a method that may be used to reduce post-read disturbs as shown in FIG. 16A. The method includes performing a read operation to read data stored in a block of memory cells arranged in NAND strings 1621 (e.g. prior to RR1 of FIG. 16A) and, subsequent to the read operation, discharging local word lines of the block to substantially zero volts 1623 (e.g. line 1624 at VS S). The method further includes isolating channels of the NAND strings 1625 (e.g. by reducing SGs illustrated by line 1509), isolating the local word lines of the block from global word lines 1627 (e.g. by reducing BLKSEL to turn off block select transistors) and subsequently applying a low positive voltage on the global word lines while the local word lines remain isolated from the global word lines 1629 (e.g. line 1620 after BLKSEL=OFF).

Appropriate circuits, such as word line driver circuits 447 of FIG. 4 in combination with circuits such as control circuitry 110 and/or controller 122 of FIG. 1A may cooperate to perform memory operations on the memory structure 126 and may be used to provide the voltage waveforms of FIG. 16A including the waveform indicated by line 1620. Such a control circuit may be configured to apply substantially zero volts to the global word lines (CG) to discharge the local word lines (WLs) to substantially zero volts (VSS), turn off the select gate transistors to isolate channels (by reducing voltage SGs), turn off the block select transistors (by reducing BLKSEL) to isolate the local word lines from the global word lines, and with the block select transistors turned off (BLKSEL=OFF), apply a low positive voltage on the global word lines as illustrated by line 1620. Such control circuits may be considered means for discharging the local word lines to substantially zero volts after a read operation and subsequently applying a low positive voltage on the global word lines while the global word lines are isolated from the local word lines.

Figure 17:
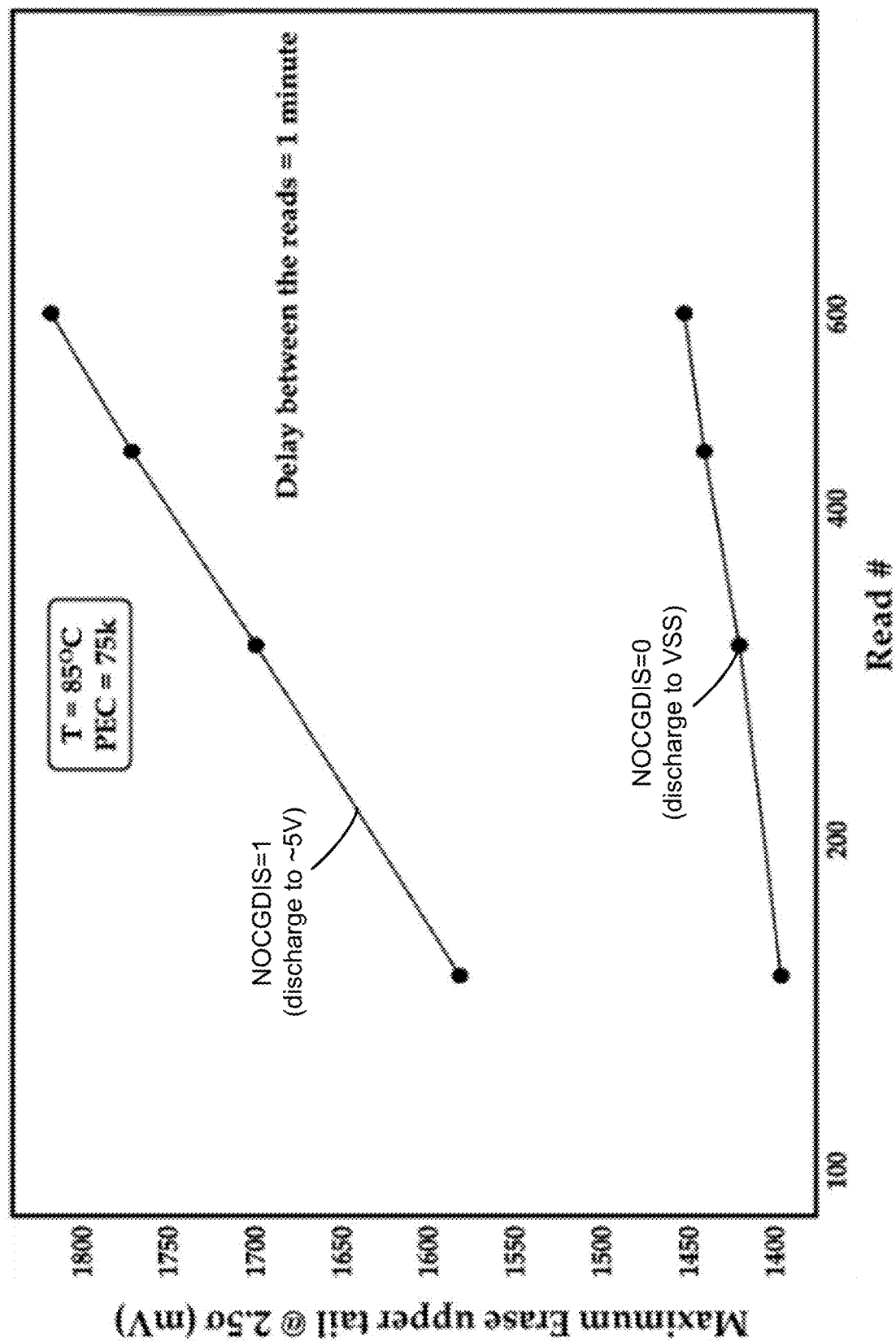
FIG. 17 shows effects of discharging word lines to VSS.

Improvement due to the above steps may be seen in the plots of FIG. 17, which compares disturbance with discharge of word lines to VSS (as shown by line 1620 of FIG. 16A)), i.e. NOCGDIS=0, and disturbance without discharge to VSS (e.g. discharge to about 5 volts, as shown by line 1506), i.e. NOCGDIS=1. It can be seen that there is significantly less disturbance with discharge to VSS for any given number of reads (indicated on the x-axis).

Continuing to apply VSS to global word lines (CG) even after BLKSEL=OFF as illustrated in FIG. 15 (e.g. line 1502) may result in quick discharge in WL potential, pushing the cells to a first read state. Instead, keeping global word lines at a low voltage such as VDD or VCC (e.g. in a range of about 1.8 to 2.5 volts) means residual voltage on local word lines may discharge more slowly and may reach equilibrium at or near the low positive voltage applied to the global word lines thus keeping the cells closer to "second read" state (i.e. leakage through block select transistors may be reduced because of reduced potential difference across select transistors so that discharge is slower and may be more limited). This may keep FBCs low when a subsequent read is performed since read levels are optimized for "second read" state.

Since disturb is generally seen on heavily cycled SLC blocks, this option and/or other options presented here can be particularly useful for such blocks and may be selectively enabled only for SLC blocks, only for blocks with high cycles, only for SLC blocks with high cycles, only at temperatures above a threshold temperature, or under some other conditions, with other blocks continuing to use a different scheme (e.g. scheme of FIG. 14). At higher cycle counts, this form of disturb (post-read disturb due to discharge) may also be more problematic in TLC and/or MLC memories. So, this option can be selectively enabled for TLC and/or MLC at higher cycles only. Disabling this feature at low cycle counts and subsequently enabling after a threshold cycle count may provide a good trade-off between disturb during delay and keeping cells in "second read" state. The present technology may include identifying a block of memory cells for post-read local word line discharge to zero volts, identifying additional blocks for post-read local word line discharge directly to a low positive voltage (which may be a default). Identifying a block of memory cells for post-read local word line discharge to zero volts may include, for example, determining that a write-erase cycle count for the block exceeds a threshold and write-erase cycle counts for the additional blocks not exceed the threshold. Suitable circuits, such as control circuitry 110 and/or controller 122 of FIG. 1A, may be configured to perform such identification and may be considered means for identifying blocks for post-read local word line discharge to substantially zero volts based on write-erase cycle count.

In a given memory, different blocks may be subject to different post-read schemes. For example, global word line voltages for some blocks may transition directly from VREAD (e.g. about 8 volts) to a low positive voltage (e.g. 1.5-2.8 volts), e.g. as shown in FIG. 14. Such a scheme may be a default scheme that is used on all blocks initially until some triggering event occurs for a block. Some blocks (e.g. blocks that have had a triggering event) may be subject to a post-read scheme such as illustrated in FIG. 16A, which transitions global word line voltage from VREAD to substantially zero volts and then to a low positive voltage as illustrated by line 1620 of FIG. 16A. The triggering event may be a one or more of: a high write-erase cycle count, a high error rate, operating as a Single Level Cell (SLC) block. The triggering event may also relate to characteristics of data stored in the block, e.g. storage of high priority data.

Method 2: Read disturb after a delay between read operations (post-read disturb) may be observed in blocks other than the block that is read. For example, EOC blocks, whose block select transistors share a control line with a block that undergoes a read operation (e.g. coupled to a common line that receives voltage "BLKSEL") may have some post-read effects from the read operation after it is completed.

Figure 18A:
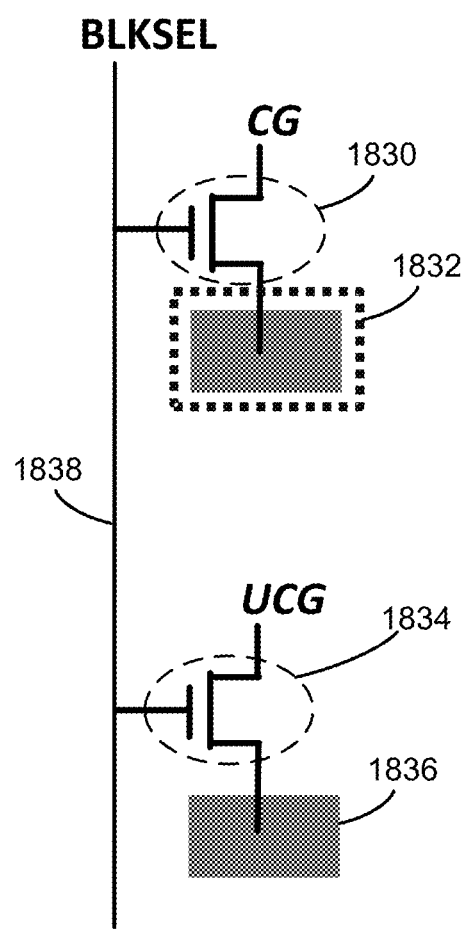
FIGS. 18A-C show examples of multiple blocks that have a common block select control line.

FIG. 18A illustrates how certain voltages discussed above relate to selected and unselected blocks of a memory system. FIG. 18A shows block select transistor 1830 of selected block 1832 and block select transistor 1834 of unselected block 1836 sharing a common control line 1838, which receives voltage BLKSEL. Block select transistor 1830 of selected block 1832 receives a voltage CG from a global word line (e.g. generated by word line driver) and selectively couples the voltage CG to a local word line of block 1832 under control of BLKSEL voltage supplied on control line 1838. Block select transistor 1834 of unselected block 1836 receives a voltage UCG from a global word line (e.g. generated by word line driver) and selectively couples the voltage UCG to a local word line of block 1836 under control of the BLKSEL voltage supplied on control line 1838. When a sufficiently high voltage is provided on control line 1838, both block select transistors 1830, 1834 are turned on so that word lines of both blocks 1832, 1836 are driven by corresponding global word line voltages CG and UCG. Select gate transistors of selected block 1832 may be turned on when it is selected (e.g. for a read operation) while select gate transistors of unselected block 1836 may be turned off. Unselected block 1836 may be considered an EOC block in this configuration. Additional EOC blocks may share control line 1838.

Figure 18B:
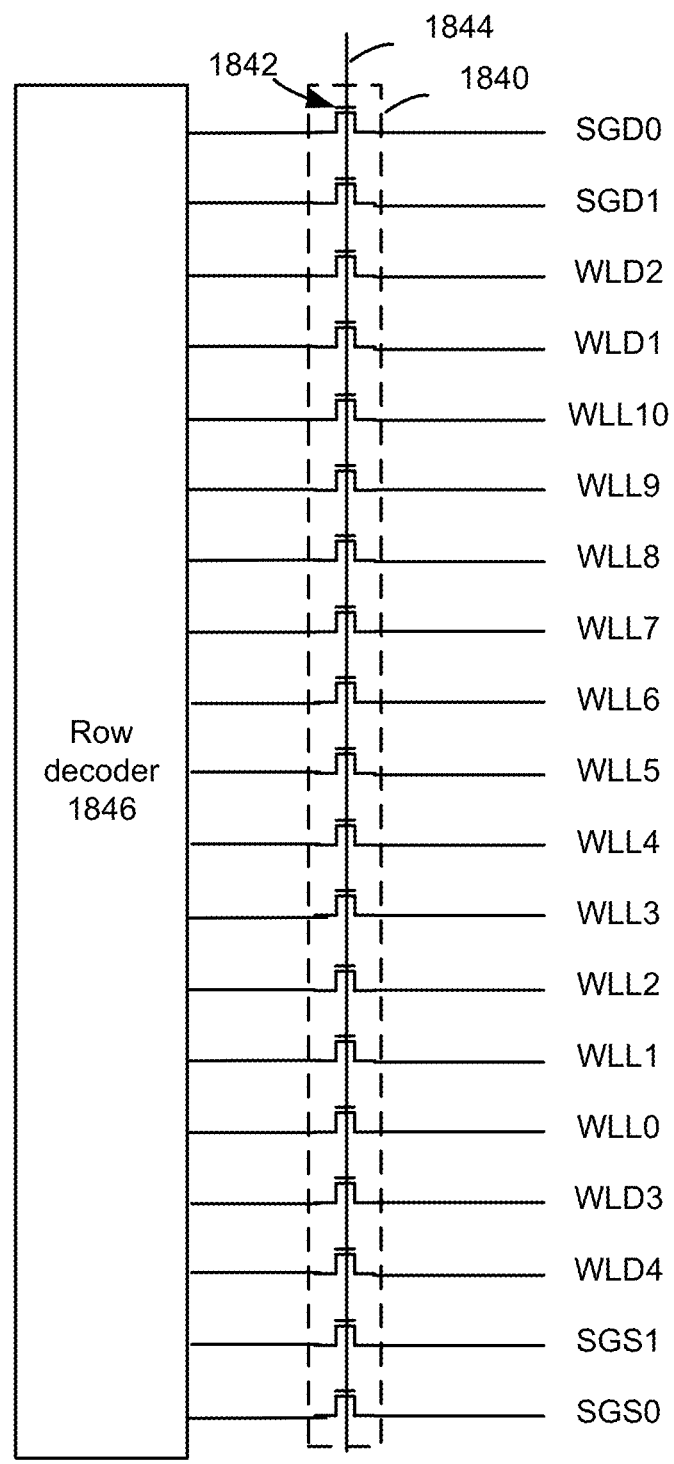

While, FIG. 18A illustrates a single block select transistor for each block, it will be understood that a block generally includes a number of local word lines and select lines and that all such lines may be controlled by block select transistors. FIG. 18B illustrates an example of block select transistors 1840 (pass gates) for a block such as blocks 1832, 1836. Local word lines WLL1-WLL10, dummy word lines WLD1-WLD4, and select gate lines SGD0, SGD1, SGS0, SGS1 (control lines) for a block are depicted. In block select transistors 1840, each individual select transistor is connected to a local control line to selectively couple it to a corresponding global control line. For example, a block select transistor 1842 is connected to selectively couple a global select gate line to corresponding local select gate line SGD0. Control gates of the block select transistors 1840 are connected to a common control line 1844. When a voltage on common control line 1844 is sufficiently high, the local control lines are connected to the voltage drivers via global control lines. When the voltage on control line 1844 is sufficiently low, the local control lines (e.g. local word lines WLL1-WLL10) are disconnected from the voltage drivers and floated. Block select transistors 1840 may be considered an example implementation of pass gates for a block as illustrated in FIG. 4 (e.g. block select transistors 1840 may correspond to a portion of pass transistors 422 for one block of BLK_0 to BLK_7).

Figure 18C:
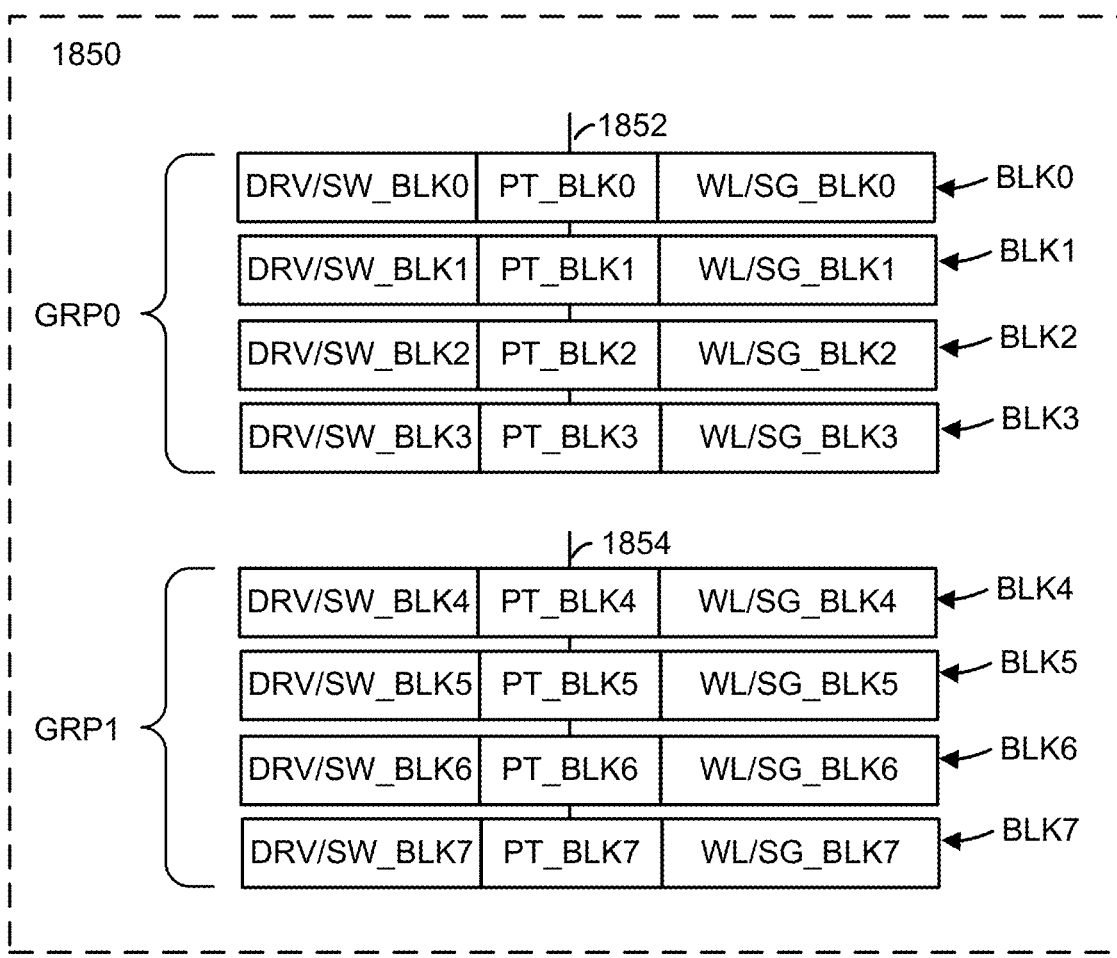

FIG. 18C provides a further illustration of an example circuit 1850 comprising a first group of blocks GRP0 having a common block select line 1852 for pass transistors of the group, and a second group of blocks GRP1 having a common block select line 1854 for pass transistors of the group. Each group is shown including corresponding voltage drivers (DRV), switches (SW), pass transistors (PT) or block select transistors, and local word lines (WL) and local select gate lines (SG) of a block. For example, in GRP0, a first block BLK0 has DRV/SW_BLK0, PT_BLK0 and WL/SG_BLK0, a second block BLK1 has DRV/SW_BLK1, PT_BLK1 and WL/SG_BLK1, a third block BLK2 has DRV/SW_BLK2, PT_BLK2 and WL/SG_BLK2 and a fourth block BLK3 has DRV/SW_BLK3, PT_BLK3 and WL/SG_BLK3. A common block select voltage may be provided for GRP0 on common block select line 1852, which couples to block select transistors of BLK0 to BLK3 as illustrated in FIG. 18B.

In GRP1, a fifth block BLK4 has DRV/SW_BLK4, PT_BLK4 and WL/SG_BLK4, a sixth block BLK5 has DRV/SW_BLK5, PT_BLK5 and WL/SG_BLK5, a seventh block BLK6 has DRV/SW_BLK6, PT_BLK6 and WL/SG_BLK6 and an eighth block BLK7 has DRV/SW_BLK7, PT_BLK7 and WL/SG_BLK7. A common block select voltage may be provided for GRP1 on common block select line 1854. This may be different to the common block select voltage provided for GRP0 on common block select line 1852. For example, a relatively high voltage (e.g. VGBST, or about 7 volts) may be provided on common block select line 1852 to turn on PT_BLK0 to PT_BLK3 (connecting global control lines with local control lines WL/SG_BLK0 to WL/SG_BLK3) to thereby select GRP0 while a relatively low voltage (e.g. VSS, 0 volts, or substantially zero volts) may be provided on common select line 1854 to turn off PT_BLK4 to PT_BLK7 (isolating global control lines from local control lines WL/SG_BLK4 to WL/SG_BLK7) to thereby unselect GRP1.

Since the voltage drivers in a set of blocks such as GRP0 or GRP1 share a common block select line for block select transistors (pass transistors) of the group, when a word line in one block is accessed, such as for programming or reading, the drivers of all four blocks will be connected to the word lines in both the accessed block and the remaining blocks (EOC blocks). In some cases, the word lines in the remaining blocks (EOC blocks) may be driven with a voltage during and/or after an access operation such as a read operation to reduce disturbance effects (e.g. post-read disturb, as described above).

Figure 19:
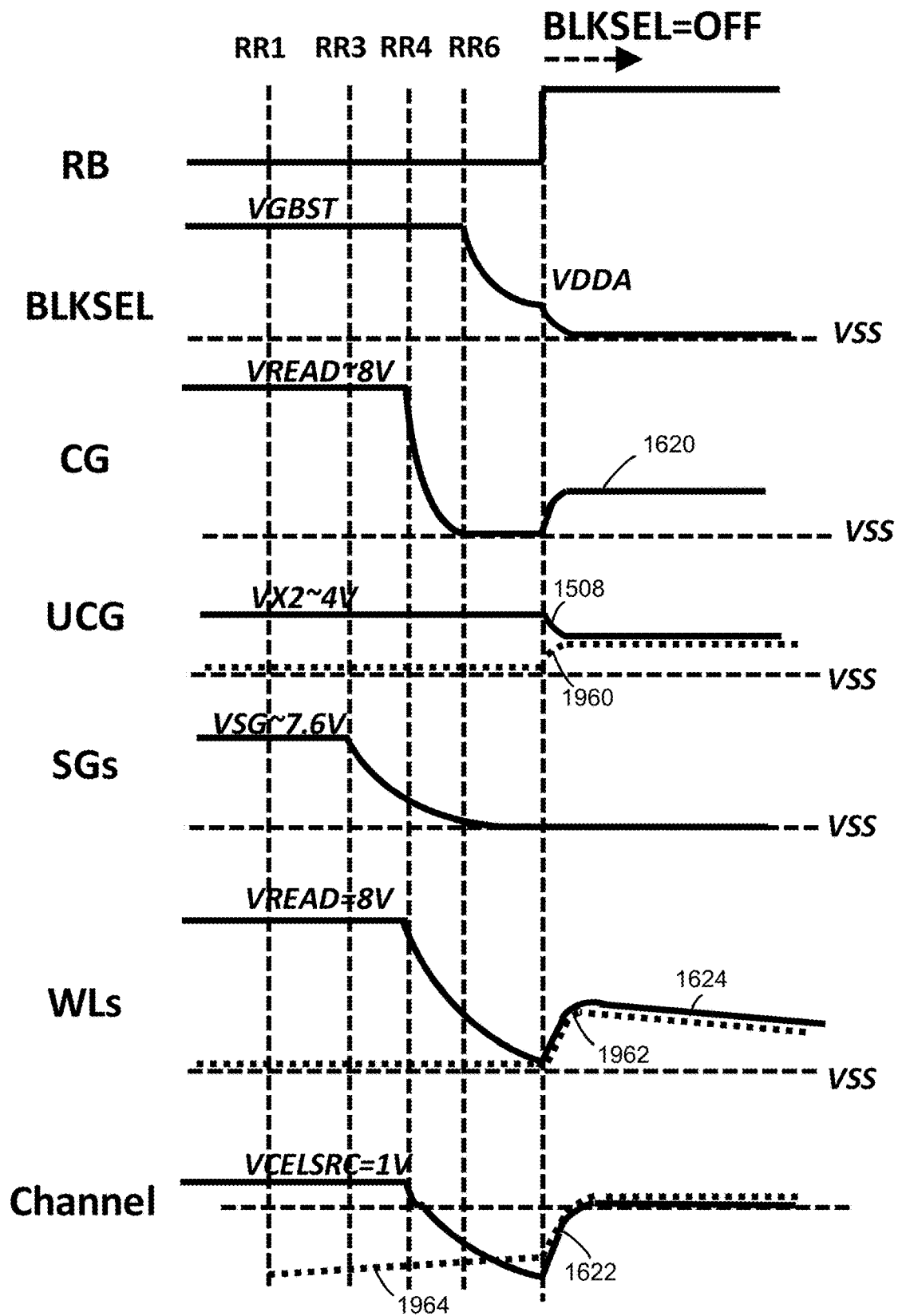
FIG. 19 is a timing diagram showing global word line voltage provided to word lines of unselected blocks (UCG) reduced to VSS and subsequently increased to a low voltage (VDD or VCC).

To reduce post-read disturb on EOC blocks in such an arrangement, a UCG waveform (applied to global word lines of unselected blocks in a group that includes a selected block) as shown in FIG. 19 may be used. This may be used in combination with a CG waveform as shown by line 1620, which was previously shown in FIG. 16A or otherwise. In this example, the voltage on global word lines to unselected blocks of a group (UCG) is kept at VSS (e.g. 0 volts) for the entire read operation and subsequently, when BLKSEL=OFF, is brought to a low positive voltage as shown by dotted line 1960. For example, to Vdd or Vcc (e.g. in a range of about 1.8 to 2.5 volts), which is the same voltage as applied to global word lines of the selected block (i.e. CG voltage) when BLKSEL=OFF. The voltage on local word lines of the EOC block shown by dotted line 1962 is also maintained at VSS during read (when block select transistors are on) and subsequently floats up in a similar manner to local word lines of the selected block shown by line 1624 (i.e., depending on the swing in its channel potential). As soon as VSS is applied to local word lines of EOC block, channel of that block couples down to negative voltage. In this way, post-read residual voltage on local word lines for EOC blocks can be reduced, but still with sufficient voltage to keep cells in "second read" state. The channel voltage of the EOC block is shown by dotted line 1964 showing that channel voltage in an EOC block will become less negative when UCG is kept at VSS throughout a read operation (the voltage represented by line 1964 is not intended to be quantitatively accurate and is provided as an illustration of voltage becoming less negative before BLKSEL=OFF).

Appropriate circuits, such as word line driver circuits 447 of FIG. 4 in combination with circuits such as control circuitry 110 and/or controller 122 of FIG. 1A may cooperate to provide the voltage waveforms of FIG. 19 including the waveforms provided to unselected blocks (e.g. waveform illustrated by line 1960 provided on global word lines of an unselected block during and after reading of a selected block). Thus, such control circuits may be configured to apply substantially zero volts to global word lines and local word lines of one or more unselected blocks during the read operation and subsequently apply the low positive voltage (e.g. VDD or VCC) on the global word lines of the one or more unselected blocks while block select transistors of the one or more unselected blocks are turned off.

Figure 20:
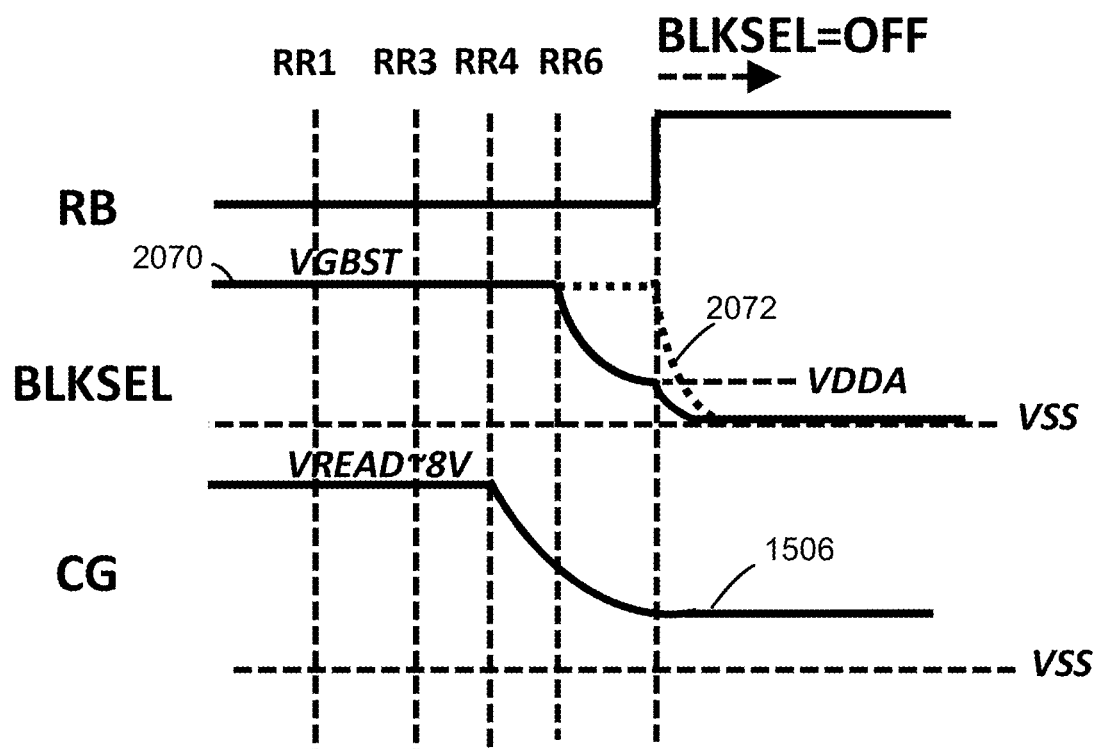
FIG. 20 is a timing diagram showing delay in reducing voltage BLKSEL to delay turning off block select transistors.

Method 3: In this method, a word line is discharged faster than previously shown at the end of a read operation as illustrated in FIG. 20. Such faster discharge may be combined with any of the methods illustrated here including CG voltage waveform of FIG. 16A and/or the UCG voltage waveform of FIG. 19 but is not limited to just these waveforms.

FIG. 20 shows two alternative waveforms for BLKSEL voltage. Waveform 2070 (solid line) shows that BLKSEL is lowered from VGBST (VG boost, which may be a high voltage such as 17 volts) to VDDA (a low positive voltage such as 2 volts) during RR6. However, local word line discharge may be slow due to which local word lines may be at a bias greater than VDDA even after RR6 (i.e. RR4-RR6 may provide insufficient time to fully discharge local word lines from a read voltage to a low positive voltage). This means block select transistors may cut off early in RR6 instead of at the end of RR6 so that local word lines start floating early in RR6. This may reduce local word line discharge even further since the main path for local word lines discharge is through block select transistors.

The scheme of FIG. 20 keeps BLKSEL voltage at VGBST (high) until the end of RR6 so that BLKSEL only starts to ramp down when BLKSEL=off as shown by line 2072. Since block select transistors are kept on with a high BLKSEL voltage, local word lines may discharge faster through block select transistors during RR6. Discharging VREAD to lower voltage at this time as shown by line 2072 means residual voltage on local word lines is low, which may reduce disturb during delay. In general, providing additional time from the time word line voltage starts to ramp down (when CG voltage ramps down) to the time BLKSEL voltage starts to ramp down may allow for greater discharge and thus result in lower residual local word line voltage. Such faster discharge may also allow for shorter discharge times so that performance may be improved.

Appropriate circuits, such as a BLKSEL driver circuit and word line driver circuits 447 of FIG. 4, in combination with circuits such as control circuitry 110 and/or controller 122 of FIG. 1A may cooperate to provide the voltage waveforms of FIG. 20 including maintaining a high voltage to gates of the block select transistors throughout a period of time when local word lines discharge (as shown by line 2072, showing VGBST maintained throughout RR4 and RR6 to discharge the local word lines) to substantially zero volts.

Method 4: In this method residual voltage on a word line may be reduced by modifying the select gate transistor waveform (SGs) as shown in FIG. 21 so that select line voltage to select gate transistors remains high and select gate transistors remain on longer than in previous examples.

As described earlier, a cause of residual potential on local word lines is the floating channels at the end of a read operation. A channel can float if either select gate transistors or memory cells (e.g. memory cells with highest threshold voltage Vt) along the channel cuts off the channel. If select gate transistors cut off first, then the channel may float when local word line voltage is still close to VREAD. Floating at such a high potential may result in channels coupling down more than if local word lines floated at a lower potential. If a channel is cut off by memory cells instead of select gate transistors, then channels may begin to float when local word line voltage is near the highest cell threshold voltage, e.g. Vt 5V, which means channel will couple down to a less negative voltage due to local word line discharge from ~5V to VSS (i.e. less than where discharge is from ~8V to ~VSS).

In order to ensure that select gate transistors do not cut off first, the discharge of select gate lines may be delayed from RR3 as shown by line 1509 (as shown in earlier figures) to after RR4, shown by dotted line 2174. Even in case where select gate transistors cut off a channel before cells cut off, delaying select gate transistor cut off may be beneficial. Local word line potential at cut-off may be significantly reduced by postponing the select gate transistor cut-off, thus providing additional discharge time and lowering the residual local word line potential as explained before.

Figure 21:
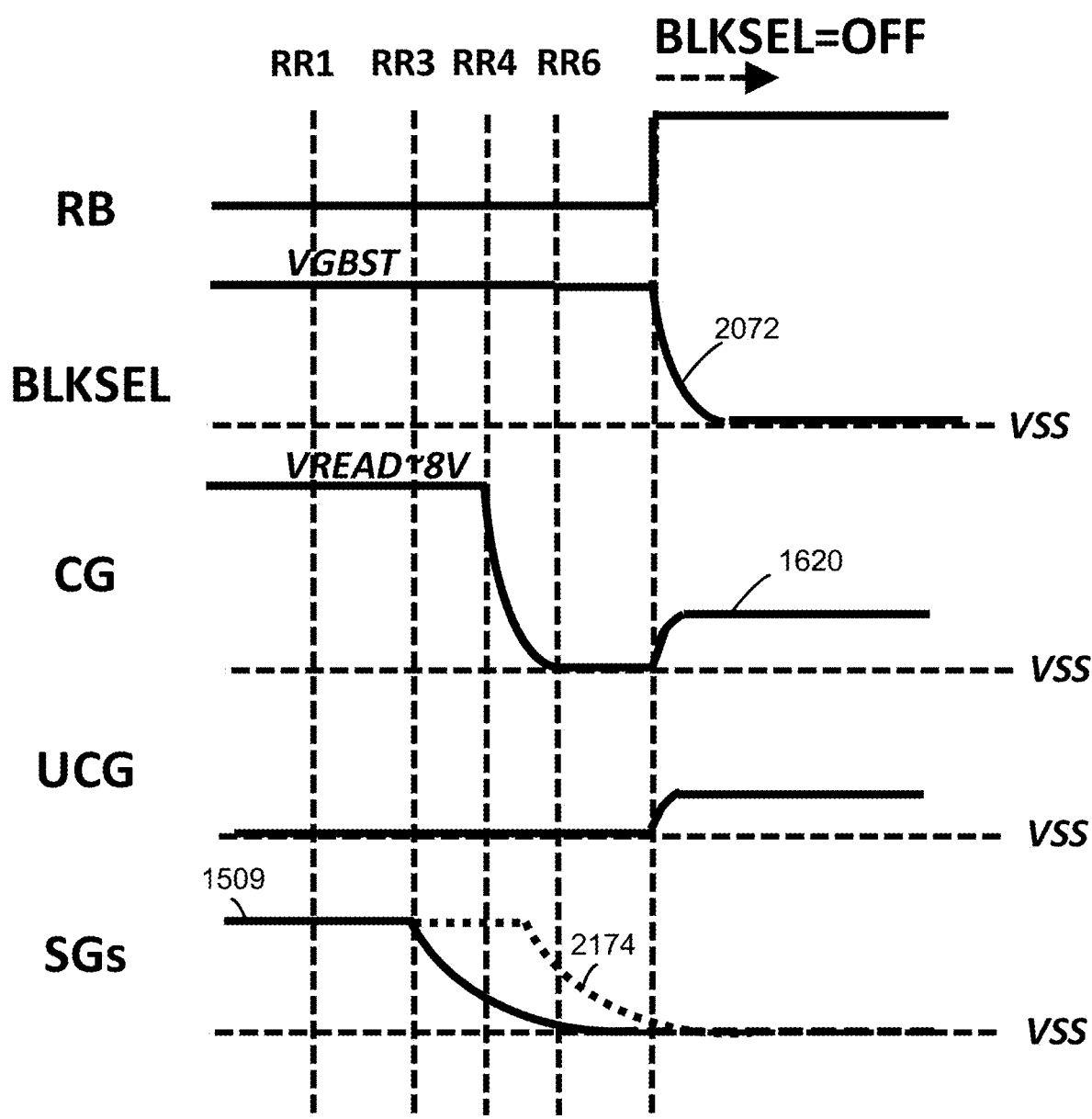
FIG. 21 is a timing diagram showing delay in discharging select gate transistor control voltage SG to delay channels becoming isolated.

Appropriate circuits, such as SGS driver 445 and SGD driver 446 of FIG. 4 in combination with circuits such as control circuitry 110 and/or controller 122 of FIG. 1A may cooperate to provide the voltage waveforms of FIG. 21 including keeping select gate transistors turned on after the read operation while substantially zero volts is applied to the global word lines (e.g. during RR4-RR6 as shown by line 1620) and the block select transistors are turned on (e.g. as shown by line 2072), and to turn off the select gate transistors after local word lines have substantially discharged (e.g. as shown by line 2174). Such circuits, in combination with select lines and select gate transistors may be considered means for coupling channels of a plurality of NAND strings to bit lines until the local word lines are discharged sufficiently to turn off at least some of the memory cells.

FIG. 22 shows the reduction in post-read disturb caused by postponing the discharge of select gate voltage (SG) from time RR3 to RR4, while discharging CG lines directly to VDD (as shown in FIG. 14) instead of VSS (as shown in FIGS. 16A and 21). The upper line 2280 shows results without postponement (SG discharge starting at RR3) while the lower line 2282 shows results with postponement (SG discharge starting at RR4). It is clear that initiating SG discharge later (e.g. at RR4 instead of RR3 in FIG. 21) provides improved disturbance data for all numbers of reads. The benefits of this delay may be in addition to improvement resulting from any other one or more of the above described methods (method 1-method 3).

It will be understood that the methods above (methods 1-4) are not mutually exclusive. While each method may provide benefits when applied individually, two or more of the methods may be combined to achieve additional improvements. While specific voltages are included in some examples, it will be understood that these are for example purposes and that the present technology is not limited to particular voltage values. For example, in the above methods, CG and UCG lines can be forced to a voltage level between VSS (at or near zero volts) and VDD/VCC (1.8/2.5 volts) instead of VSS.

The present technology as described above has several advantages over previous approaches including:
1. Provides good trade-off between 'read disturb with delay' and "first read" issue to minimize the FBC.
2. Increases the read disturb capability of the products—big improvement at End Of Life (EOL).
3. Applicable for both SLC, TLC, and MLC ('read disturb with delay' can be a potential bottleneck even for TLC and MLC). Or can be applied selectively, e.g. only for SLC which has higher endurance requirements.
4. Helps by reducing failure rate, increasing yield and reducing ECC frequency (improves cost efficiency).

An example of an apparatus includes a plurality of NAND strings in a block, each NAND string comprising a source-end select gate transistor, a drain-end select gate transistor, and memory cells between the source-end select gate transistor and the drain-end select gate transistor. Local word lines are connected to cells in the plurality of NAND strings, the local word lines selectively coupled to global word lines by block select transistors. Select lines are connected to select gate transistors in the plurality of NAND strings. A control circuit is configured to, after a read operation of memory cells of the block: apply substantially zero volts to the global word lines to discharge the local word lines to substantially zero volts, turn off the select gate transistors to isolate channels, turn off the block select transistors to isolate the local word lines from the global word lines, and with the block select transistors turned off, apply a low positive voltage on the global word lines.

The control circuit may be further configured to apply substantially zero volts to global word lines and local word lines of one or more unselected blocks during the read operation and subsequently apply the low positive voltage on the global word lines of the one or more unselected blocks while block select transistors of the one or more unselected blocks are turned off. A read voltage may be applied to global word lines and local word lines during a read operation is in the range of 7.0 to 9.0 volts and the low positive voltage is in the range of 1.5-2.5 volts. The control circuit may be configured to apply substantially zero volts to the global word lines throughout a period of time after the read operation and to maintain a high voltage to gates of the block select transistors throughout the period of time to discharge the local word lines to substantially zero volts. The control circuit may be further configured to keep select gate transistors turned on after the read operation while substantially zero volts is applied to the global word lines and the block select transistors are turned on, and to turn off the select gate transistors after local word lines have substantially discharged. The control circuit may be configured to turn off the select gate transistors only after the local word lines have discharged sufficiently for at least a portion of the memory cells to be non-conductive. The apparatus may include a plurality of additional blocks, the control circuit configured to, after a read operation of memory cells of the one or more additional blocks, transition global word lines directly from a read voltage to the low positive voltage to discharge the local word lines from the read voltage to an intermediate voltage that is between the read voltage and the low positive voltage. The block may be selected for discharging the local word lines to substantially zero volts based on characteristics of the block or data stored in the block. The characteristics of the block or data stored in the block may include one or more of: a high write-erase cycle count, a high error rate, operating as a Single Level Cell (SLC) block.

An example of a method includes performing a read operation to read data stored in a block of memory cells arranged in NAND strings. Subsequent to the read operation, the method further includes, discharging local word lines of the block to substantially zero volts, isolating channels of the NAND strings, isolating the local word lines of the block from global word lines, and subsequently applying a low positive voltage on the global word lines while the local word lines remain isolated from the global word lines.

The method may include applying substantially zero volts to global word lines and local word lines of one or more unselected blocks during the read operation and subsequently applying the low positive voltage on the global word lines of the one or more unselected blocks while the global word lines of the one or more unselected blocks are isolated from the local word lines of the one or more blocks. The method may include applying substantially zero volts to the global word lines throughout a period of time after the read operation and maintaining a connection between the global word lines and the local word lines throughout the period of time to discharge the local word lines to substantially zero volts. The method may include maintaining select gate transistors of the NAND strings in a conductive state during the period of time that substantially zero volts is applied to the global word lines and switching the select gate transistors of the NAND strings to a non-conductive state during the period of time, after local word lines have discharged sufficiently for at least a portion of the memory cells to be non-conductive. The method may include identifying the block of memory cells for post-read local word line discharge to zero volts and identifying additional blocks for post-read local word line discharge directly to the low positive voltage. Identifying the block of memory cells for post-read local word line discharge to zero volts may include determining that a write-erase cycle count for the block exceeds a threshold and write-erase cycle counts for the additional blocks not exceed the threshold. Discharging local word lines of the block to substantially zero volts may include discharging from a read voltage in the range of 7.0 to 9.0 volts to a range of −0.5 to 0.5 volts (or −1.0 to 1.0 volts in certain cases) and the low positive voltage may be in a range of 1.0 to 2.0 volts. Discharging local word lines of the block to substantially zero volts may include applying substantially zero volts to the local word lines through global word lines and block select transistors for a period, isolating channels of the NAND strings may include turning off select gate transistors of the NAND strings after the local word lines have discharged sufficiently that at least some memory cells of the block are non-conductive, and isolating the local word lines of the block from global word lines may occur after local word lines have discharged to substantially zero volts and channels are isolated.

An example of an apparatus may include a plurality of NAND strings in a block, each NAND string comprising a source-end select gate transistor, a drain-end select gate transistor, and memory cells between the source-end select gate transistor and the drain-end select gate transistor. Local word lines are connected to cells in the plurality of NAND strings. The local word lines are selectively coupled to global word lines by block select transistors. Select lines are connected to select gate transistors in the plurality of NAND strings. The apparatus further includes means for discharging the local word lines to substantially zero volts after a read operation and subsequently applying a low positive voltage on the global word lines while the global word lines are isolated from the local word lines.

The apparatus may include means for identifying blocks for post-read local word line discharge to substantially zero volts based on write-erase cycle count. The apparatus may include means for coupling channels of the plurality of NAND strings to bit lines until the local word lines are discharged sufficiently to turn off at least some of the memory cells.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
   a plurality of NAND strings in a block, each NAND string comprising a source-end select gate transistor, a drain-end select gate transistor, and memory cells between the source-end select gate transistor and the drain-end select gate transistor;
   word lines connected to cells in the plurality of NAND strings, the word lines selectively coupled to global word lines by block select transistors;
   select lines connected to select gate transistors in the plurality of NAND strings; and
   a control circuit, the control circuit configured to, after a read operation of memory cells of the block:
      apply substantially zero volts to the global word lines to discharge the word lines to substantially zero volts;
      turn off the select gate transistors to isolate channels;
      turn off the block select transistors to isolate the word lines from the global word lines; and
      with the block select transistors turned off, apply a low positive voltage on the global word lines.

2. The apparatus of claim 1 wherein the control circuit is further configured to apply substantially zero volts to global word lines and word lines of one or more unselected blocks during the read operation and subsequently apply the low positive voltage on the global word lines of the one or more unselected blocks while block select transistors of the one or more unselected blocks are turned off.

3. The apparatus of claim 2 wherein a read voltage applied to global word lines and word lines during a read operation is in the range of 7.0 to 9.0 volts and the low positive voltage is in the range of 1.5-2.5 volts.

4. The apparatus of claim 1 wherein the control circuit is configured to apply substantially zero volts to the global word lines throughout a period of time after the read operation and to maintain a high voltage to gates of the block select transistors throughout the period of time to discharge the word lines to substantially zero volts.

5. The apparatus of claim 1 wherein the control circuit is further configured to keep select gate transistors turned on after the read operation while substantially zero volts is applied to the global word lines and the block select transistors are turned on, and to turn off the select gate transistors after word lines have substantially discharged.

6. The apparatus of claim 5 wherein the control circuit is configured to turn off the select gate transistors only after the word lines have discharged sufficiently for at least a portion of the memory cells to be non-conductive.

7. The apparatus of claim 1 wherein the apparatus includes a plurality of additional blocks, the control circuit configured to, after a read operation of memory cells of the one or more additional blocks, transition global word lines directly from a read voltage to the low positive voltage to discharge the word lines from the read voltage to an intermediate voltage that is between the read voltage and the low positive voltage.

8. The apparatus of claim 7 wherein the block is selected for discharging the word lines to substantially zero volts based on characteristics of the block or data stored in the block.

9. The apparatus of claim 8 wherein the characteristics of the block or data stored in the block includes one or more of: a high write-erase cycle count, a high error rate, operating as a Single Level Cell (SLC) block.

10. A method comprising:
    performing a read operation to read data stored in a block of memory cells arranged in NAND strings;
    subsequent to the read operation, discharging local word lines of the block to substantially zero volts;
    isolating channels of the NAND strings;
    isolating the local word lines of the block from global word lines; and
    subsequently applying a low positive voltage on the global word lines while the local word lines remain isolated from the global word lines.

11. The method of claim 10 further comprising:
    applying substantially zero volts to global word lines and local word lines of one or more unselected blocks during the read operation; and
    subsequently applying the low positive voltage on the global word lines of the one or more unselected blocks while the global word lines of the one or more unselected blocks are isolated from the local word lines of the one or more blocks.

12. The method of claim 10 further comprising:
    applying substantially zero volts to the global word lines throughout a period of time after the read operation; and
    maintaining a connection between the global word lines and the local word lines throughout the period of time to discharge the local word lines to substantially zero volts.

13. The method of claim 12 further comprising:
    maintaining select gate transistors of the NAND strings in a conductive state during the period of time that substantially zero volts is applied to the global word lines; and
    switching the select gate transistors of the NAND strings to a non-conductive state during the period of time, after local word lines have discharged sufficiently for at least a portion of the memory cells to be non-conductive.

14. The method of claim 10 further comprising:
    identifying the block of memory cells for post-read local word line discharge to zero volts; and
    identifying additional blocks for post-read local word line discharge directly to the low positive voltage.

15. The method of claim 14 wherein identifying the block of memory cells for post-read local word line discharge to zero volts includes determining that a write-erase cycle count for the block exceeds a threshold and write-erase cycle counts for the additional blocks not exceed the threshold.

16. The method of claim 10 wherein discharging local word lines of the block to substantially zero volts includes discharging from a read voltage in the range of 7.0 to 9.0 volts to a range of −1.0 to 1.0 volts and the low positive voltage is in a range of 1.0 to 2.0 volts.

17. The method of claim 10 wherein discharging local word lines of the block to substantially zero volts includes applying substantially zero volts to the local word lines through global word lines and block select transistors for a period, isolating channels of the NAND strings includes turning off select gate transistors of the NAND strings after the local word lines have discharged sufficiently that at least some memory cells of the block are non-conductive, and isolating the local word lines of the block from global word lines occurs after local word lines have discharged to substantially zero volts and channels are isolated.

18. An apparatus, comprising:
   a plurality of NAND strings in a block, each NAND string comprising a source-end select gate transistor, a drain-end select gate transistor, and memory cells between the source-end select gate transistor and the drain-end select gate transistor;
   local word lines connected to cells in the plurality of NAND strings, the local word lines selectively coupled to global word lines by block select transistors;
   select lines connected to select gate transistors in the plurality of NAND strings; and
   means for discharging the local word lines to substantially zero volts after a read operation and subsequently applying a low positive voltage on the global word lines while the global word lines are isolated from the local word lines.

19. The apparatus of claim 18 further comprising: means for identifying blocks for post-read local word line discharge to substantially zero volts based on write-erase cycle count.

20. The apparatus of claim 18 further comprising: means for coupling channels of the plurality of NAND strings to bit lines until the local word lines are discharged sufficiently to turn off at least some of the memory cells.

* * * * *